United States Patent
Okuno et al.

(10) Patent No.: US 10,157,914 B2
(45) Date of Patent: Dec. 18, 2018

(54) MULTI-LAYER SEMICONDUCTOR DEVICE STRUCTURE

(71) Applicant: TAIWAN SEMICONDUCTOR MANUFACTURING CO., LTD., Hsinchu (TW)

(72) Inventors: Yasutoshi Okuno, Hsinchu (TW); Yi-Tang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/867,144

(22) Filed: Jan. 10, 2018

(65) Prior Publication Data

US 2018/0130797 A1    May 10, 2018

Related U.S. Application Data

(60) Continuation of application No. 14/933,096, filed on Nov. 5, 2015, now Pat. No. 9,893,056, which is a
(Continued)

(51) Int. Cl.
*H01L 27/06* (2006.01)
*H01L 21/8234* (2006.01)
(Continued)

(52) U.S. Cl.
CPC ...... *H01L 27/0688* (2013.01); *G03F 7/70633* (2013.01); *G03F 9/708* (2013.01);
(Continued)

(58) Field of Classification Search
CPC . H01L 27/0688; H01L 29/20; H01L 29/1602; H01L 29/1608; H01L 29/16;
(Continued)

(56) References Cited

U.S. PATENT DOCUMENTS

| 4,612,083 | A | 9/1986 | Yasumoto et al. |
| 5,770,483 | A | 6/1998 | Kadosh et al. |
| 6,429,152 | B1 | 8/2002 | Yang et al. |
| 6,452,284 | B1 | 9/2002 | Sheck |
| 7,220,655 | B1 | 5/2007 | Hause et al. |
| 8,431,436 | B1 | 4/2013 | Nguyen |
| 2003/0008472 | A1* | 1/2003 | Yoshimura ........ H01L 21/76264 438/400 |

(Continued)

FOREIGN PATENT DOCUMENTS

KR    20010110186    12/2001

OTHER PUBLICATIONS

Notice of Final Office Action Korean Patent Application No. 10-2016-0065675 dated May 22, 2017 with English translation.
(Continued)

*Primary Examiner* — Marc Armand
*Assistant Examiner* — Sue Tang
(74) *Attorney, Agent, or Firm* — McDermott Will & Emery LLP

(57) ABSTRACT

One embodiment of the instant disclosure provides a semiconductor structure that comprises: a first device layer including a first active layer disposed over a substrate and a first gate layer disposed on the active layer, where at least one of the first active layer and the first gate layer includes a first layer alignment structure; a first bounding layer disposed over the first device layer, the first bounding layer including an opening arranged to detectably expose the first layer alignment structure; and a second device layer disposed over the bounding layer including a second layer alignment structure, where the second layer alignment structure is substantially aligned to the first layer alignment structure through the opening.

20 Claims, 34 Drawing Sheets

Related U.S. Application Data division of application No. 14/044,088, filed on Oct. 2, 2013, now Pat. No. 9,202,788.

(51) Int. Cl.

| | | |
|---|---|---|
| *H01L 23/544* | (2006.01) | |
| *H01L 27/12* | (2006.01) | |
| *G03F 7/20* | (2006.01) | |
| *G03F 9/00* | (2006.01) | |
| *H01L 27/092* | (2006.01) | |
| *H01L 29/16* | (2006.01) | |
| *H01L 29/20* | (2006.01) | |

(52) U.S. Cl.
CPC ........ *G03F 9/7073* (2013.01); *H01L 21/8234* (2013.01); *H01L 23/544* (2013.01); *H01L 27/092* (2013.01); *H01L 27/1207* (2013.01); *H01L 29/16* (2013.01); *H01L 29/1602* (2013.01); *H01L 29/1608* (2013.01); *H01L 29/20* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC . H01L 27/092; H01L 23/544; H01L 21/8234; H01L 27/1207; H01L 2924/0002; H01L 2223/544; G03F 9/708; G03F 7/70633; G03F 9/7073
USPC .......................................... 257/350
See application file for complete search history.

(56) References Cited

U.S. PATENT DOCUMENTS

| | | |
|---|---|---|
| 2003/0223630 A1 | 12/2003 | Adel et al. |
| 2004/0060898 A1* | 4/2004 | Tsai .................... B81C 99/0065 216/2 |
| 2004/0135226 A1 | 7/2004 | Yoshimura et al. |
| 2006/0223271 A1 | 10/2006 | Nara et al. |
| 2008/0080112 A1 | 4/2008 | Lin et al. |
| 2008/0160726 A1* | 7/2008 | Lim .................. H01L 21/02381 438/479 |
| 2009/0189310 A1 | 1/2009 | Kling et al. |
| 2011/0233617 A1* | 9/2011 | Or-Bach .......... H01L 21/76254 257/202 |

OTHER PUBLICATIONS

China Office Action issued in corresponding Chinese Application No. 201310389008.7, dated Dec. 20, 2016.
Korean Office Action issued in corresponding Korean Application No. 10-2014-0129162, dated Sep. 16, 2015.
German Office Action issued in corresponding German Application No. 10 2013 112 351.1, dated Jun. 12, 2014.
Korea Office Action issued in corresponding Korean Application No. 10-2016-0065675, dated Aug. 5, 2016.
Final Office Action issued in U.S. Appl. No. 14/933,096, dated May 4, 2017.
Non-Final Office Action issued in U.S. Appl. No. 14/933,096, dated Sep. 22, 2016.
Notice of Allowance issued in U.S. Appl. No. 14/933,096, dated Oct. 4, 2017.

\* cited by examiner

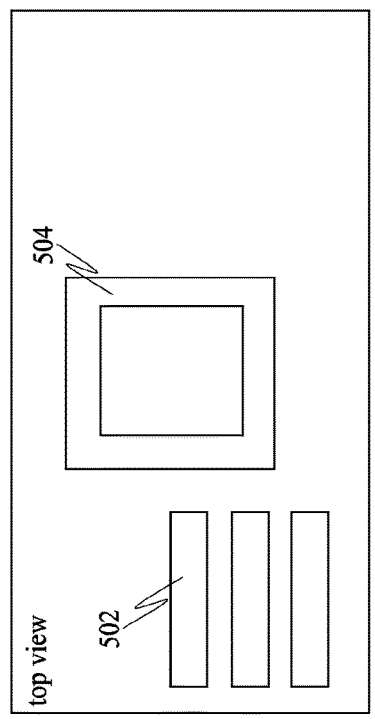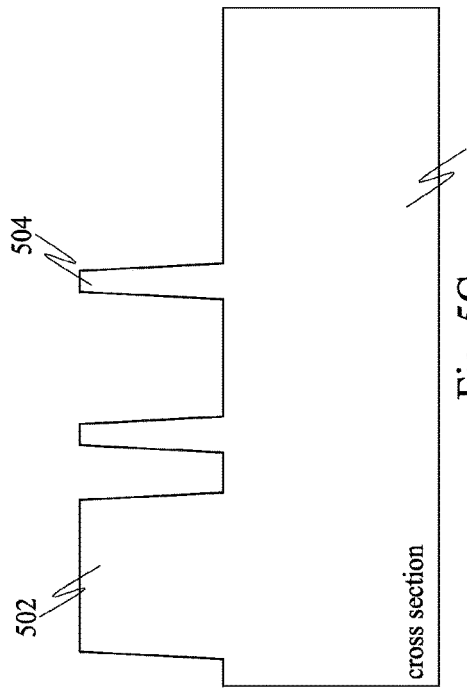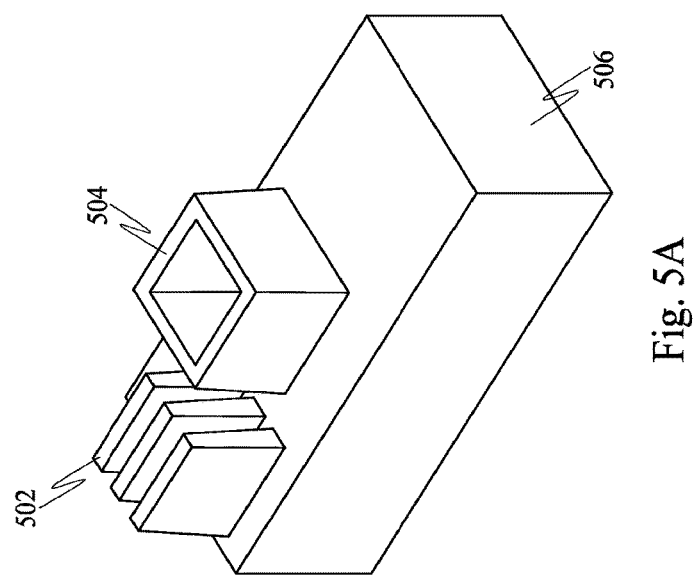
Fig. 5B
Fig. 5C
Fig. 5A

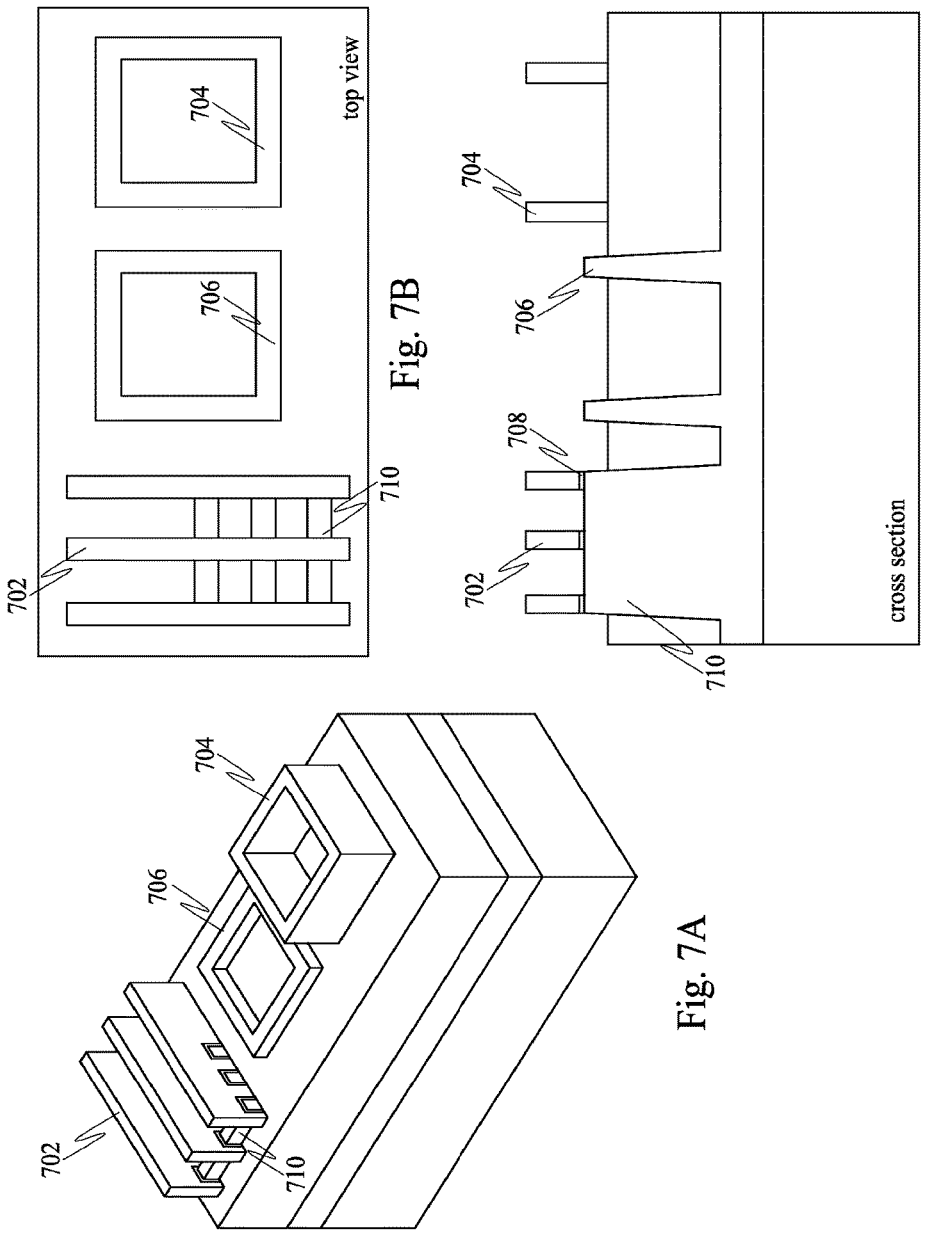

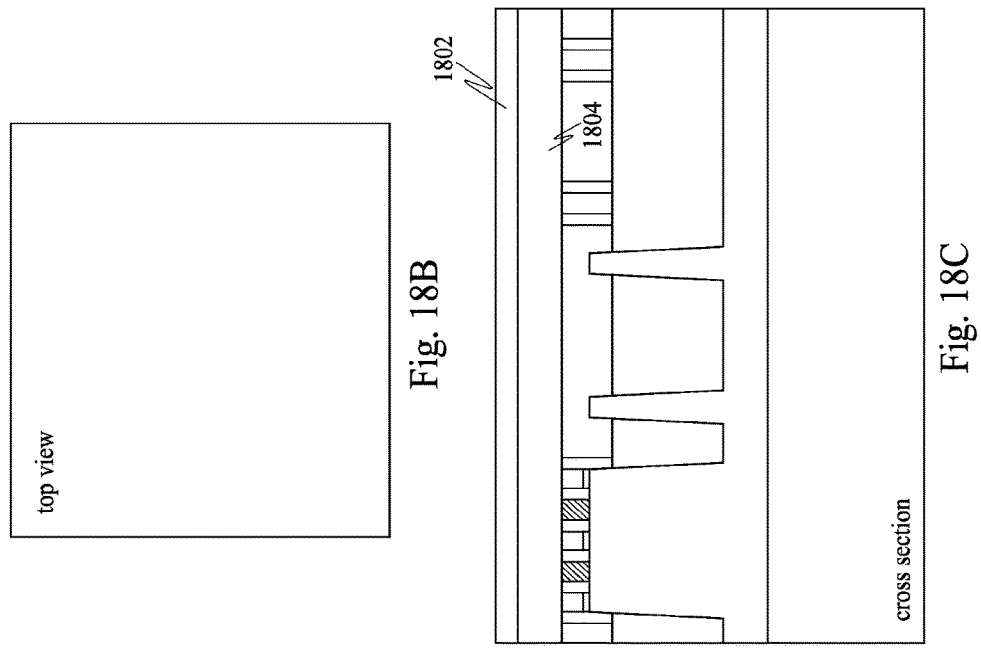
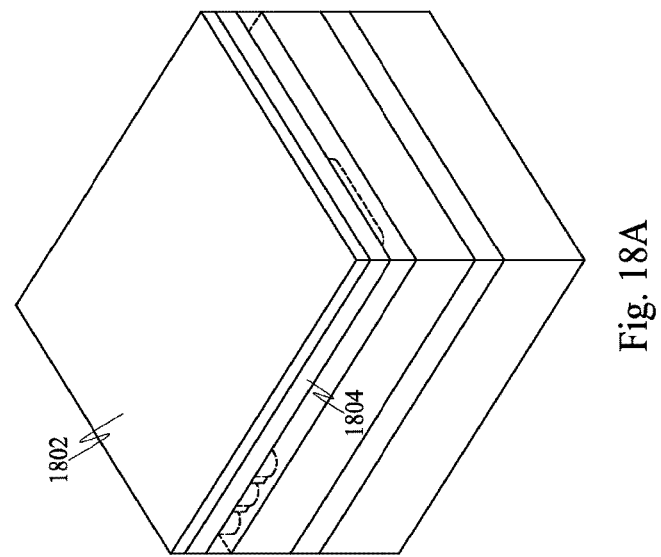
Fig. 18B
Fig. 18C
Fig. 18A

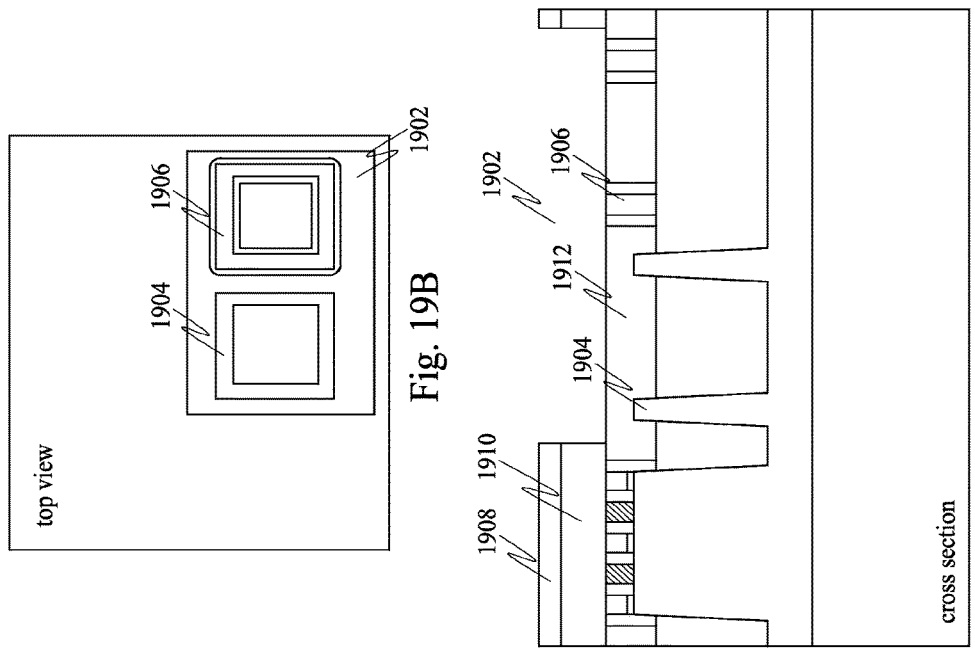
Fig. 19B
Fig. 19C
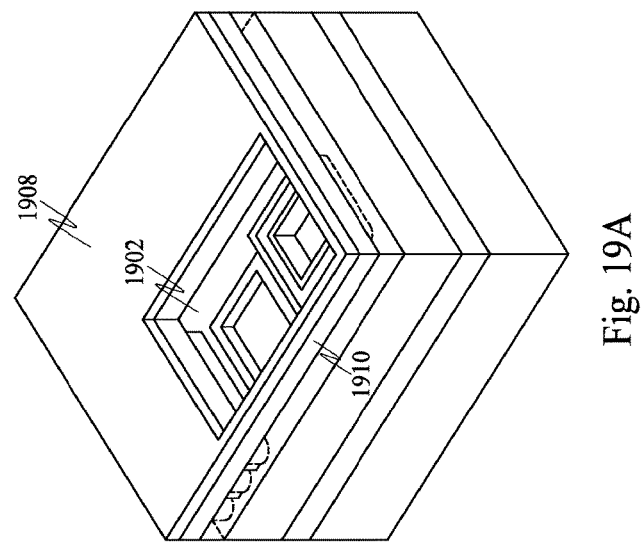
Fig. 19A

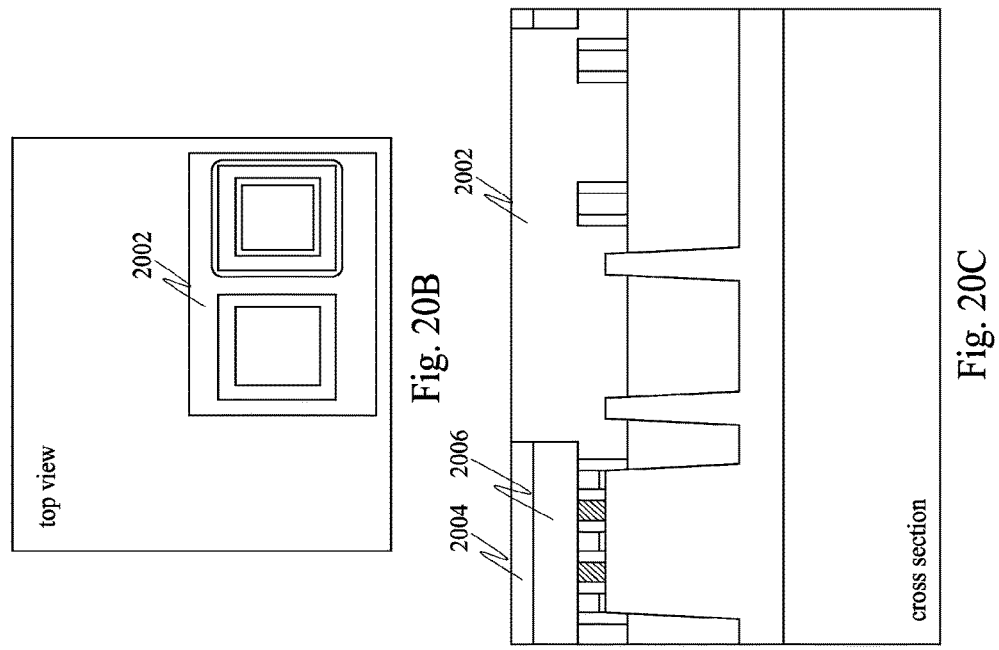

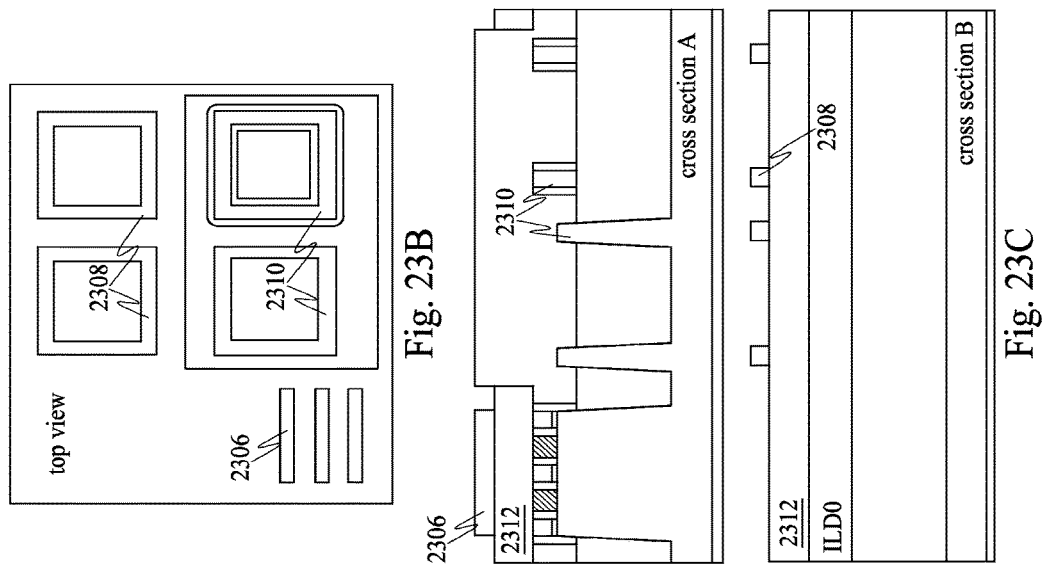
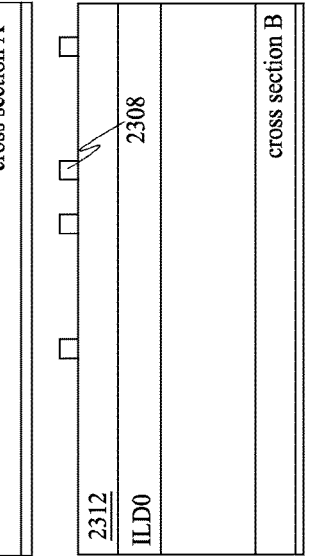
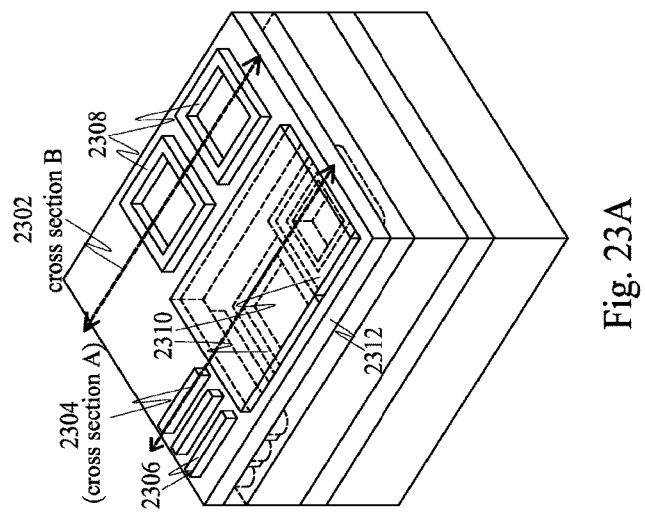
Fig. 23B
Fig. 23C
Fig. 23A

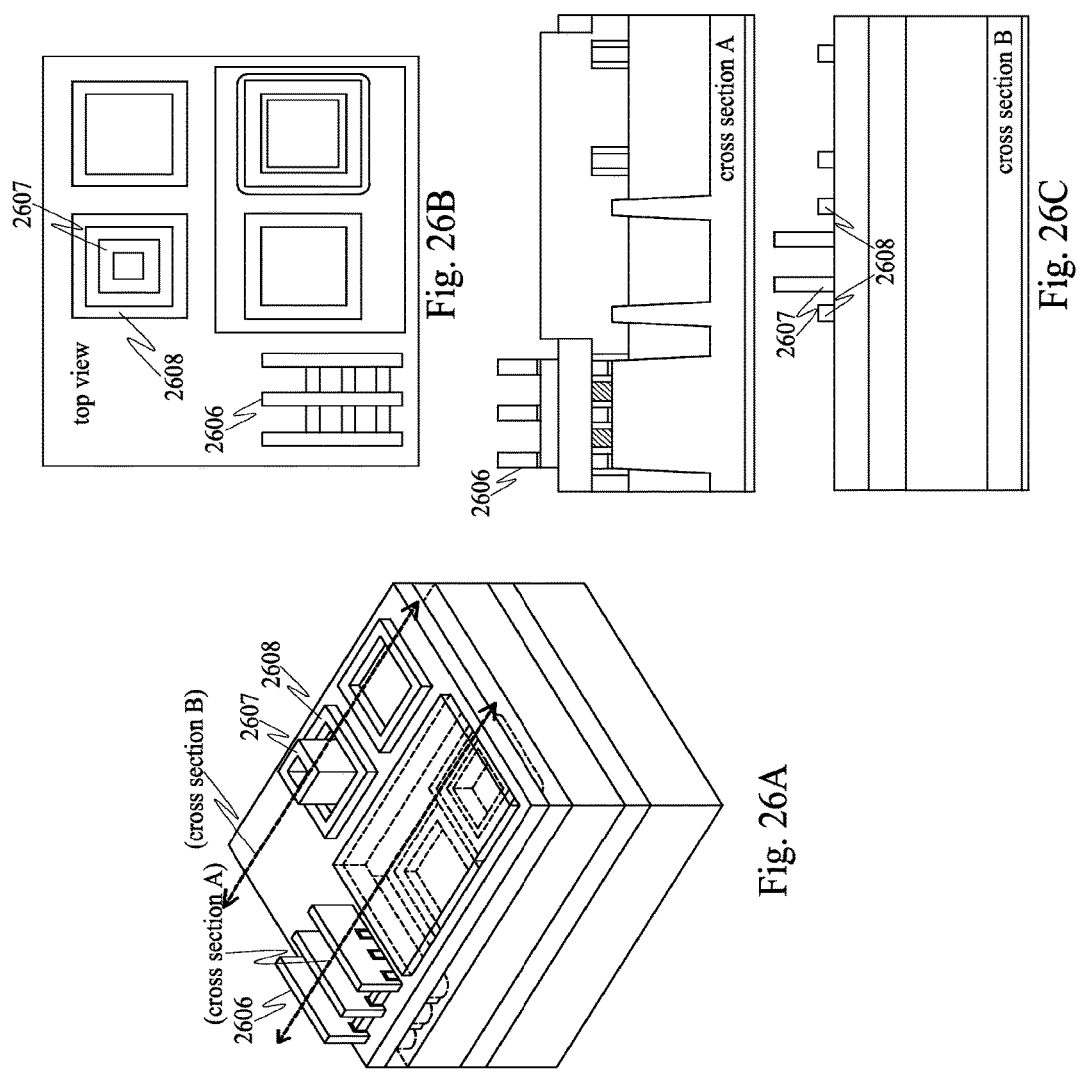

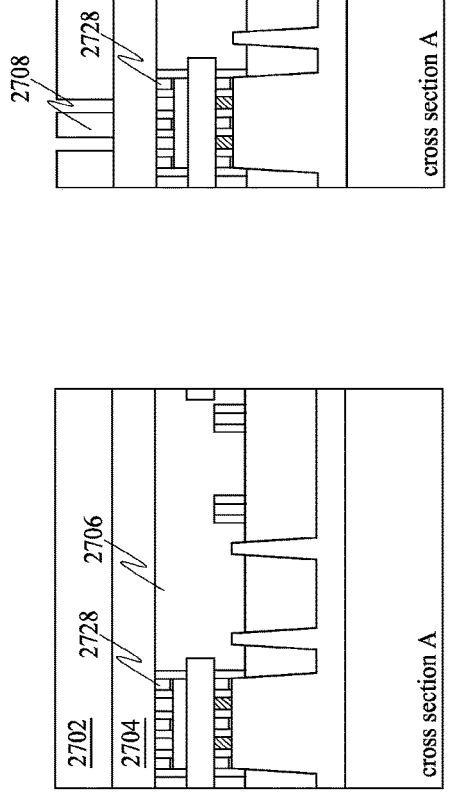
Fig. 27A
Fig. 27B
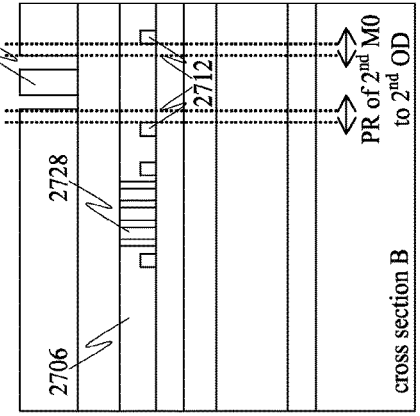
Fig. 27D
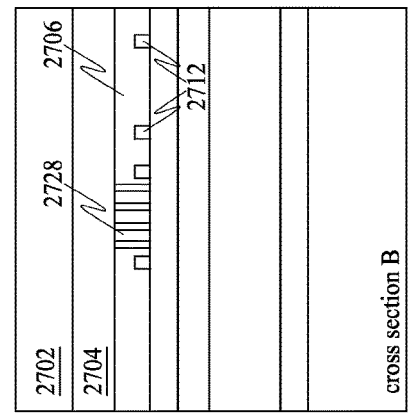
Fig. 27C

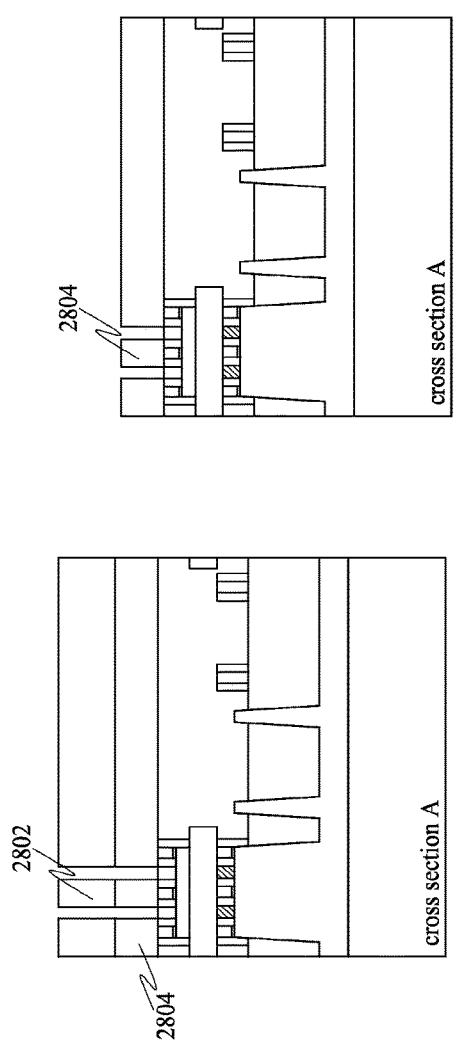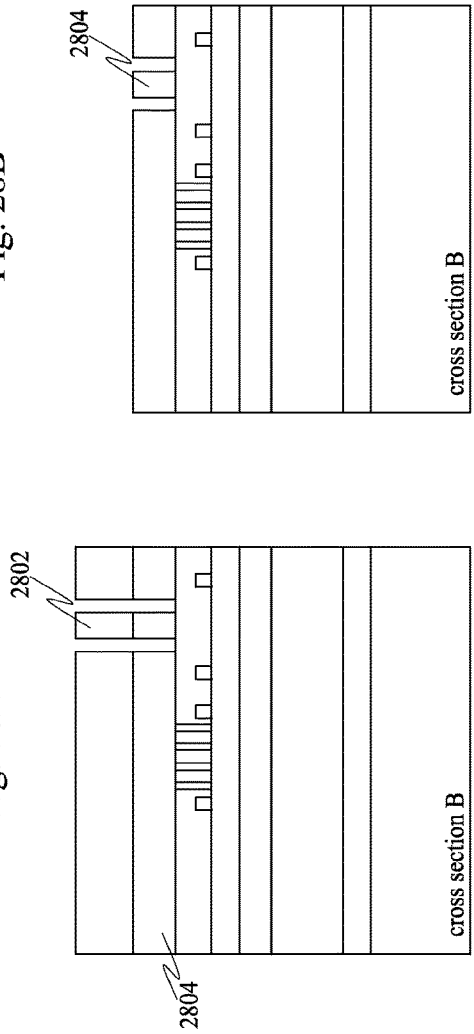
Fig. 28A
Fig. 28B
Fig. 28C
Fig. 28D

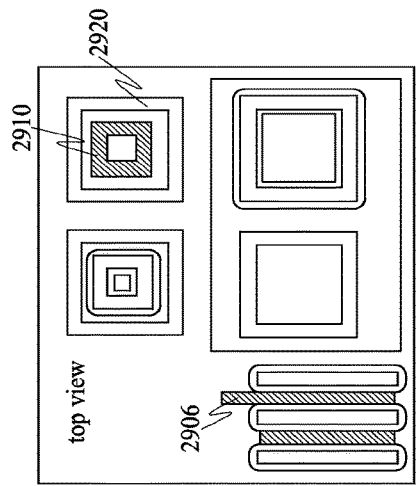
Fig. 29B
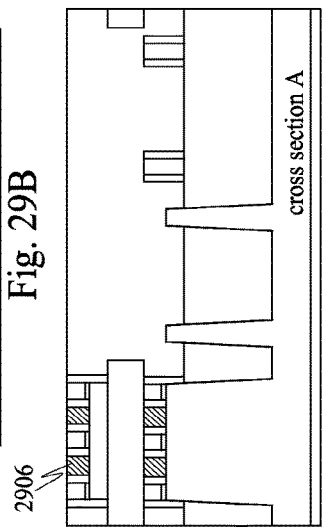
Fig. 29C
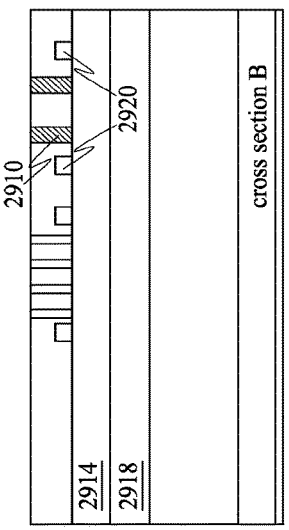
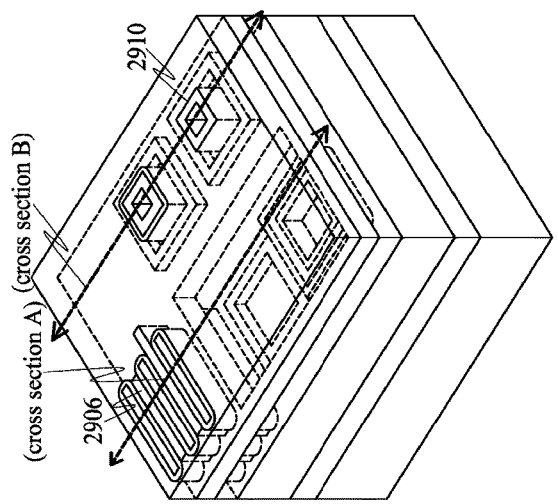
Fig. 29A

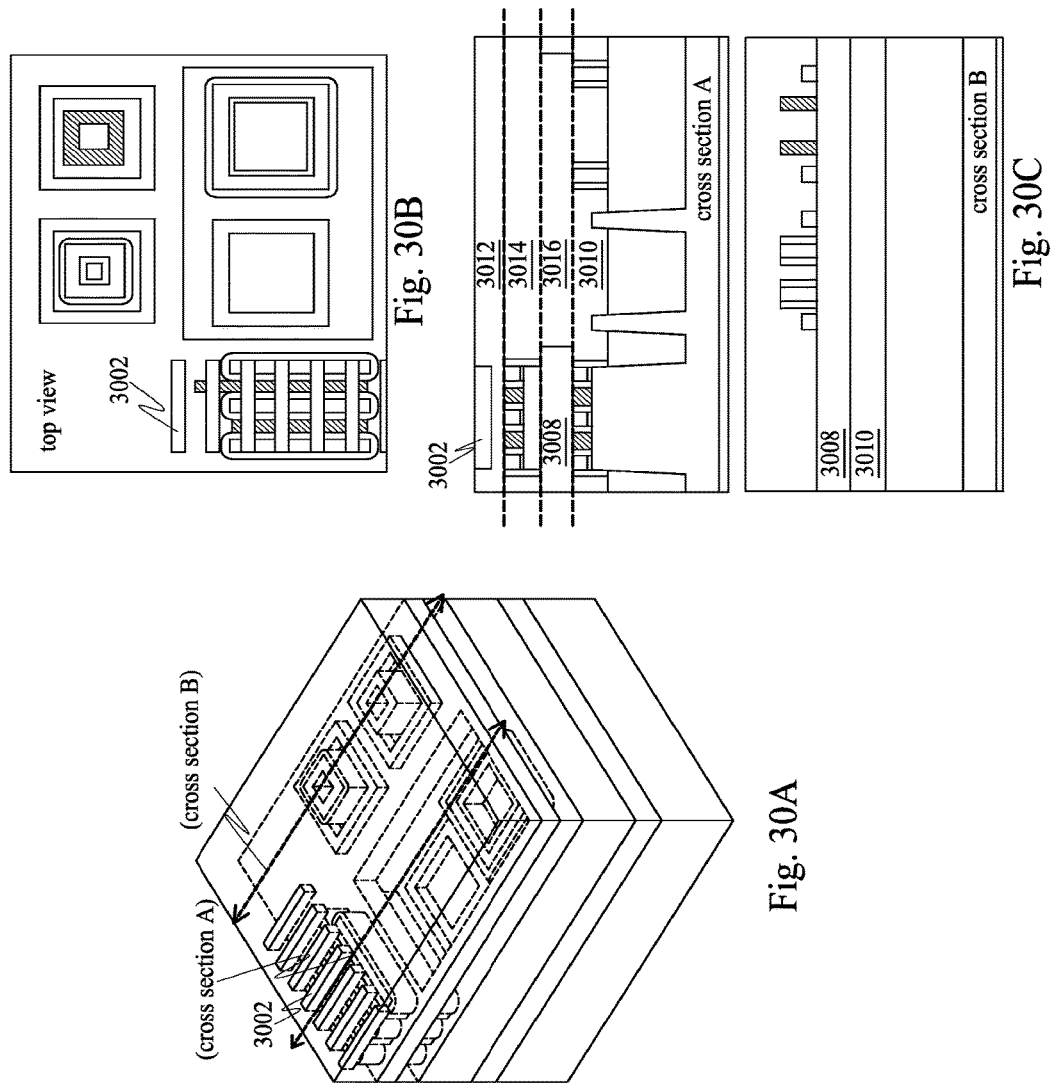

MULTI-LAYER SEMICONDUCTOR DEVICE STRUCTURE

CROSS-REFERENCE TO RELATED APPLICATIONS

This application is a continuation of U.S. application Ser. No. 14/933,096, filed Nov. 5, 2015, which is a divisional application of U.S. patent application Ser. No. 14/044,088, filed Oct. 2, 2013, the entire contents of which are incorporated herein by reference.

TECHNICAL FIELD

The technology described in this disclosure relates generally to semiconductor device structures and more particularly to a multi-layer semiconductor device structure.

BACKGROUND

Conventional complementary metal-oxide-semiconductor (CMOS) technology may be used to fabricate a large number of semiconductor devices, such as metal-oxide-semiconductor field effect transistors (MOSFETs) and bipolar junction transistors (BJTs), at approximately a same level on a single integrated-circuit (IC) chip.

BRIEF DESCRIPTION OF THE FIGURES

FIGS. 5A, 5B, and 5C depict structures etched into a substrate.

FIGS. 7A, 7B, and 7C depict portions of a first gate region of a first transistor in a multi-layer semiconductor structure.

FIGS. 18A, 18B, and 18C depict a second channel material layer and a dielectric layer that are deposited substantially over a planar surface of a first transistor layer.

FIGS. 19A, 19B, and 19C depict a patterning of a second channel material layer and a dielectric layer to define an opening in the layers.

FIGS. 20A, 20B, and 20C depict a transparent material used to fill an opening that is defined in a second channel material layer and a dielectric layer.

FIGS. 23A, 23B, and 23C depict patterning of a second OD region, where features of a BARC layer are used as a mask in the patterning.

FIGS. 26A, 26B, and 26C depict patterning of a second gate region, where features of a BARC layer are used as a mask in the patterning.

FIGS. 27A, 27B, 27C, and 27D depict steps used in patterning a second conductive (M0) region of a second transistor structure.

FIGS. 28A, 28B, 28C, and 28D depict patterning of a BARC layer to define features in the BARC layer.

FIGS. 29A, 29B, and 29C depict patterning of a second conductive M0 region, where features of a BARC layer are used as a mask in the patterning.

FIGS. 30A, 30B, and 30C depict a semiconductor device structure with a conductive layer M1 defined above a second device layer.

DETAILED DESCRIPTION

Figure 1:
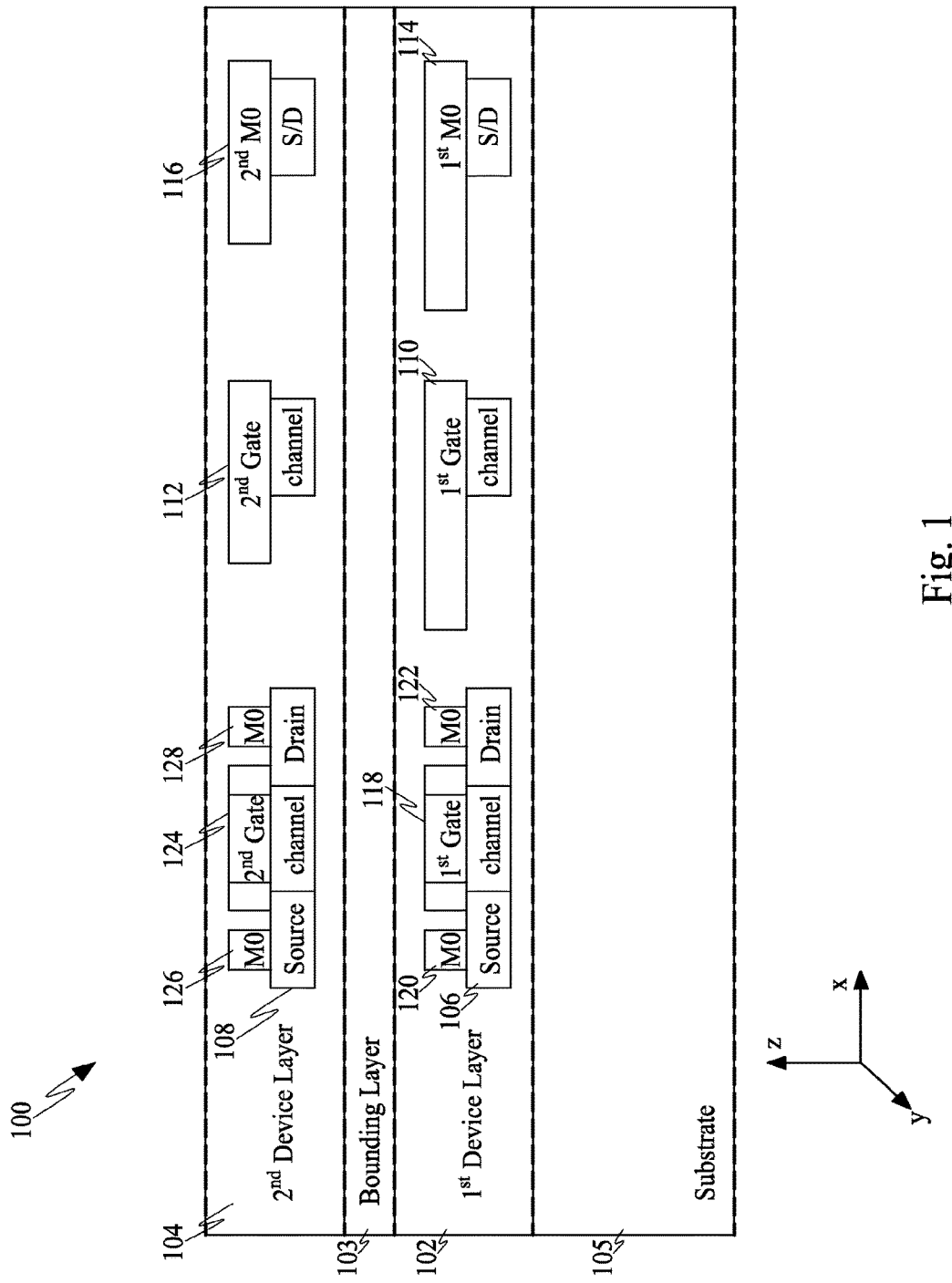
FIG. 1 depicts an example diagram of a multi-layer semiconductor device structure.

FIG. 1 depicts an example diagram of a multi-layer semiconductor device structure 100. As shown in FIG. 1, the semiconductor device structure 100 may include multiple device layers, including, for example, a first device layer 102, a second device layer 104, and a bounding layer 103 separating the first and the second device layers 102, 104. Within each device layer, one or more semiconductor devices may be formed (e.g., planar MOSFETs, FinFETs, BJTs, diodes, capacitors, etc). The use of multiple transistors that are fabricated on different layers of a vertical stack structure may be used to integrate n-MOSFET technology and p-MOSFET technology with different channel materials. For example, although it may be difficult to integrate the n-MOSFET technology (e.g., using GaAs channel material, a III-V group semiconductor material) and the p-MOSFET technology (e.g., using Ge channel material, a IV group semiconductor material) in a same substrate or a same device layer, such technologies may be integrated by fabricating the different transistor types individually within different layers of a vertical stack structure. In the example of FIG. 1, the first device layer 102 is formed substantially over a substrate 105. The substrate 105 may be a bulk silicon substrate or may be a semiconductor-on-insulator (SOI, e.g., silicon-on-insulator) substrate. The bounding layer 103 may be a dielectric layer (e.g., ILD oxide) formed substantially over the first device layer 102 and may also serve as a glue layer or other type of buffer layer that vertically connects the first device layer 102 and the second device layer 104. Further, the bounding layer 103 may be used as a medium for bonding the second device layer 104 to the first device layer 102. The bounding layer 103 (generally, oxide-related material) also provide isolation between the second device layer 104 to the first device layer 102.

Transistors 106 and 108 may be fabricated in the first and the second device layers 102 and 104, respectively. The transistor 106 may include a gate electrode structure 118, a source electrode structure 120, and a drain electrode structure 122, as depicted in FIG. 1. The transistor 108 may similarly include a gate electrode structure 124, a source electrode structure 126, and a drain electrode structure 128. In each of the transistors 106, 108, the source and drain regions may together comprise an active region of the transistor or a portion of the active region of the transistor. The active region for each of the transistors 106, 108 may also be known as an "OD" region (e.g., gate oxidation region, source/drain diffusion region). The source and drain electrodes 120, 122, 126, 128 of the transistors 106, 108 may include conductive regions that are referred to as "M0" (i.e., $0^{th}$ Metal layer to connect source/drain region of the transistor) regions, as reflected in FIG. 1. The M0 regions may include polycrystalline silicon, various metals (e.g., Al, W, Cu), or other conductive materials.

Conductive layers 110 (e.g., first gate) and 112 (e.g., second gate) may be configured to electrically connect to the gate electrode structures 118 and 124, respectively. Similarly, conductive layers 114 (e.g., first M0) and 116 (e.g., second M0) may be configured to electrically connect to the source/drain electrode structures of the transistors 106 and 108, respectively. In addition, inter-level connection structures may be constructed to connect different conductive layers or electrode structures of the first device layer 102 and the second device layer 104. Thus, various connection structures may be used to electrically connect regions within a single device layer and also to electrically connect regions that are located at different layers 102, 104 of the structure 100.

In defining the inter-level connection structures to connect the regions located at different layers 102, 104 of the structure 100, various features of the layers 102, 104 may be precisely aligned relative to one another. For example, if the gate electrode structure 118 of the first device layer 102 is to be electrically connected to the gate electrode structure 124 of the second device layer 104 (e.g., by means of an electrical via), the gate electrode structure 124 of the second device layer 104 may be located directly above the gate electrode structure 118 of the first device layer 102, such that the electrode structures 118, 124 are aligned. Such alignment between the features 118, 124 of the different layers 102, 104 may be complicated, however, by the bounding layer 103 and second channel material. The bounding layer 103 may be of a thickness and material such that the bounding layer 103 is opaque. In addition, various second channel material layers such as Ge, SiGe, SiC, GaAs and InGaAs may be used. The optical properties of these various materials may be different from conventional silicon material and may also be opaque to the lithography alignment system. Due to the opaque nature of the these layers, precise alignment between the features of the first device layer 102 and the second device layer 104 may be difficult. To accommodate the opaque nature of the bounding layer 103 and the second channel material, FIGS. 2A-31 describe structures and methods used for lithography alignment between the first and the second layers 102, 104 when fabricating the multi-layer semiconductor device structure 100.

Figures 2A, 2B:
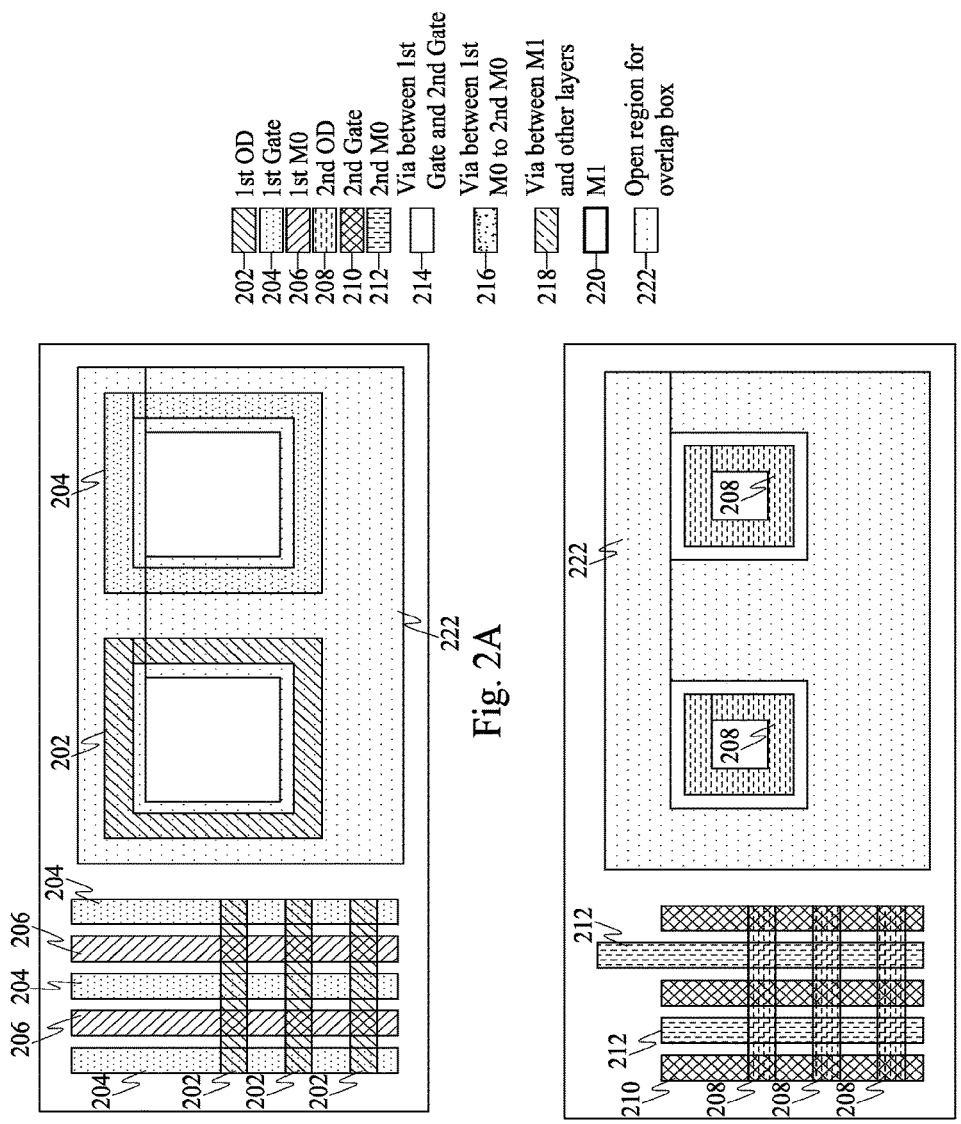
FIGS. 2A, 2B, and 2C depict a layout (or masks) of a main circuit (e.g., a logic inverter in this embodiment) and a set of overlap boxes for performing a lithography alignment check.
Figure 2C:
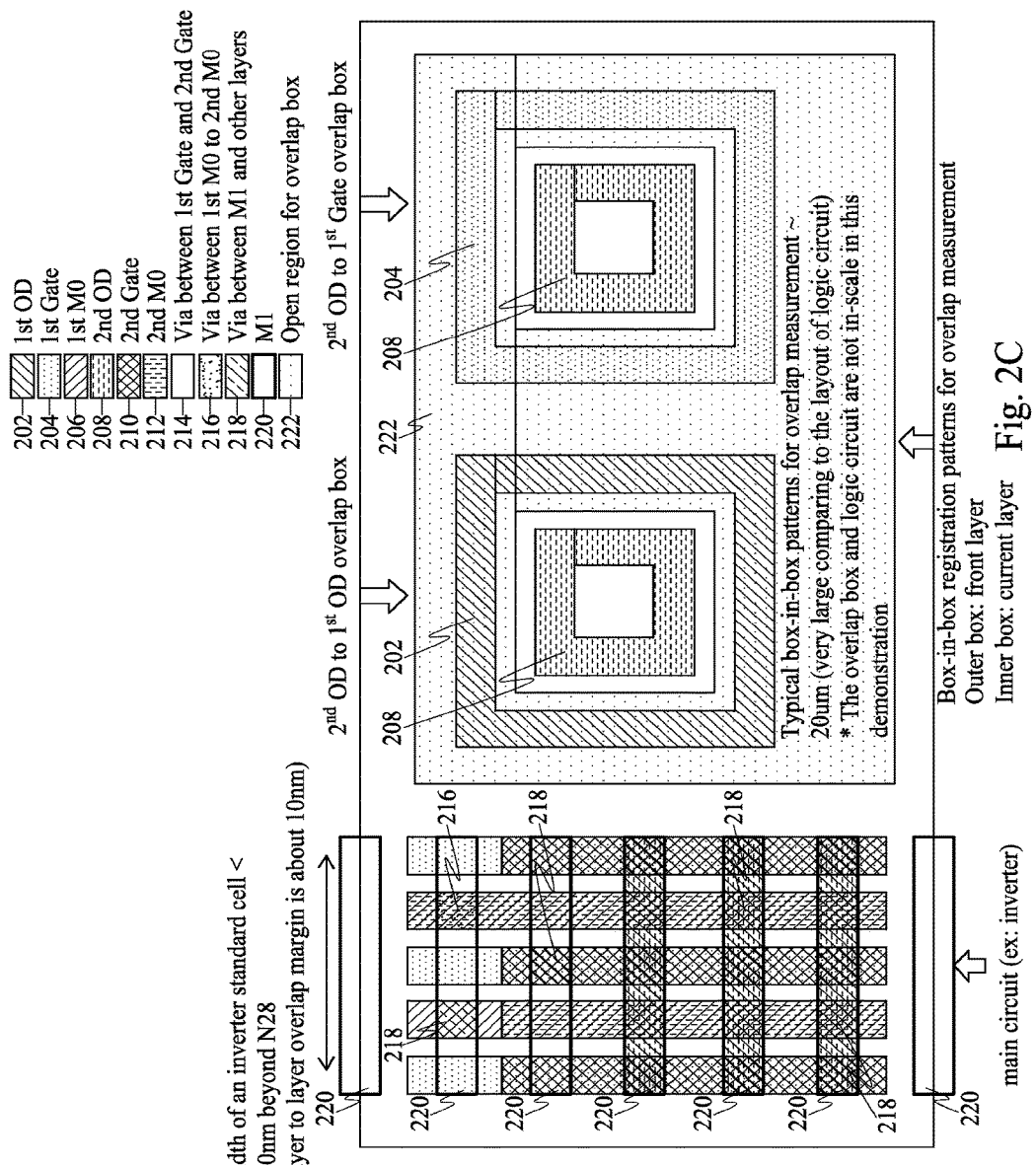

A first exemplary structure and method used for lithography alignment between first and second layers of a multi-layer semiconductor device structure are illustrated in FIGS. 2A-15C. FIGS. 2A, 2B, and 2C depict a layout (or masks) of a main circuit (e.g., a logic inverter in this embodiment) and a set of overlap boxes for performing a lithography alignment check. As depicted in FIG. 2C, the main logic circuit includes a device defined by various features of a first layer and a second layer of a multi-layer semiconductor device, where the features of the first and the second layers are aligned using first and second overlap boxes (i.e., "$2^{nd}$ OD to $1^{st}$ OD overlap box" and "$2^{nd}$ OD to $1^{st}$ Gate overlap box").

In FIGS. 2A-2C, the layout/mask is used to define various parts of the multi-layer structure and includes features for defining a $1^{st}$ OD 202, a $1^{st}$ gate 204, a $1^{st}$ M0 206, a $2^{nd}$ OD 208, a $2^{nd}$ gate 210, a $2^{nd}$ M0 212, a via between the $1^{st}$ gate and the $2^{nd}$ gate 214, a via between the $1^{st}$ M0 and the $2^{nd}$ M0 216, a via between M1 and other layers 218, M1 220, and an open region for the overlap box 222. The layout/mask for a first set of related layers is depicted in FIG. 2A, and the layout/mask for a second set of related layers is depicted in FIG. 2B. From FIGS. 2A and 2B, it can be seen that the layout/mask portions for the $1^{st}$ OD 202, the $1^{st}$ gate 204, and the $2^{nd}$ OD 208 each include some patterns in the main logic circuit (e.g., as depicted in the leftmost portions of FIGS. 2A and 2B) and some patterns in the overlap box (e.g., as depicted in the rightmost portions of FIGS. 2A and 2B). In FIG. 2C, the first and second sets of related layers are combined to form an overall layout/mask for the main circuit and the overlap boxes. To reduce confusion, in illustrating the mask/layout of the main circuit in FIG. 2C, only additional layers added in FIG. 2C (e.g., those layers not depicted in the main circuit mask/layout of FIGS. 2A and 2B) are highlighted with reference numbers (e.g., numbers 216, 218, 220). The additional layers added in the mask/layout of the main circuit in FIG. 2C include M1 features 220 and vias 216, 218.

As described above with reference to FIG. 1, the first layer of the multi-layer semiconductor device may be formed substantially over a substrate and may include a first semiconductor device (e.g., a first transistor), and the second layer of the multi-layer semiconductor device may include a second semiconductor device (e.g., a second transistor). The first and the second layers may be separated in the vertical dimension by a dielectric layer (e.g., a bounding layer including a glue material) that is opaque. To align features of the first and the second layers, an opening region 222 may be defined. The opening region 222 may allow, for example, features (e.g., alignment structures) of the first layer to be visible during the patterning of the second layer.

As depicted in the mask/layout of FIGS. 2A, 2B, and 2C, a first overlap box may allow alignment of $2^{nd}$ OD to $1^{st}$ OD features, and a second overlap box may allow alignment of $2^{nd}$ OD to $1^{st}$ gate features. The $1^{st}$ OD and the $1^{st}$ gate may be patterned in the first layer, and the $2^{nd}$ OD may be patterned in the second layer. The first layer, formed substantially over the substrate, may include the first transistor, where the first transistor includes the $1^{st}$ OD and the $1^{st}$ gate. The second layer, formed substantially over the dielectric layer that is positioned over the first layer, may include the second transistor, where the second transistor includes the $2^{nd}$ OD and the $2^{nd}$ gate. An alignment structure may be patterned in the $1^{st}$ OD and the $1^{st}$ gate of the first layer (e.g., using the mask/layout depicted in FIG. 2A). The first and the second transistors may have, for example, a FinFET structure, a planar structure, or other structure. The first and the second transistors may be, for example, of a p-MOSFET type, an n-MOSFET type, or another type. In patterning the features of the second layer, the alignment structure defined in the $1^{st}$ OD and the $1^{st}$ gate may be used for lithography alignment. For example, a feature defined in the $2^{nd}$ OD of the second layer may be aligned relative to the alignment structure patterned in the $1^{st}$ OD and the $1^{st}$ gate. The feature defined in the $2^{nd}$ OD may be patterned using the mask/layout depicted in FIG. 2B, for example. As noted above, the rectangular or square features defined in the $1^{st}$ OD and the $1^{st}$ gate may be visible during the patterning of the second device layer due to the opening region 222 included in the mask/layout.

The overlap boxes implement a box-in-box registration pattern for aligning the first and second layers of the multi-transistor-layer semiconductor structure, but various other designs and patterns for alignment marks may be used. The box-in-box patterns may include dimensions on a micrometer scale (e.g., dimensions approximately equal to 20 µm). Similarly, dimensions of the opening region 222 may be on a micrometer scale. By contrast, the features of the first and the second layers in the main logic circuit with the multi-transistor-layer structure may have smaller features with dimensions on a nanometer scale (e.g., a layer to layer overlap margin may be equal to or smaller than approximately 10 nm). For example, the main logic circuit may include a standard inverter cell with dimensions on the order of less than 200 nm. The main logic circuit may also be, for example, a logic gate or logic device, a static random access memory (SRAM) cell or SRAM-based device, or a passive device (e.g., bipolar junction transistor, diode, or capacitor). It should thus be understood that the overlap boxes and the features of the main logic circuit are not drawn to scale in the example of FIGS. 2A, 2B, and 2C (i.e., the dimensions of the main logic circuit are approximately an order of magnitude smaller than those of the overlap boxes, despite their similar sizes in FIGS. 2A, 2B, and 2C).

The main logic circuit may be comprised of various regions of the first layer (e.g., $1^{st}$ OD, $1^{st}$ gate, $1^{st}$ M0) and various regions of the second layer (e.g., $2^{nd}$ OD, $2^{nd}$ gate, $2^{nd}$ M0) that are electrically connected by various in-plane electrical connection structures and inter-level vias 216, 218. As described above with reference to FIG. 1, various features of the first and the second layers may be aligned relative to one another. The alignment may allow the inter-level vias to make correct electrical connections between various regions of the different layers. In FIG. 2, by aligning the features in the first and the second overlap boxes, the features of the main logic circuit may be properly aligned.

Figure 3:
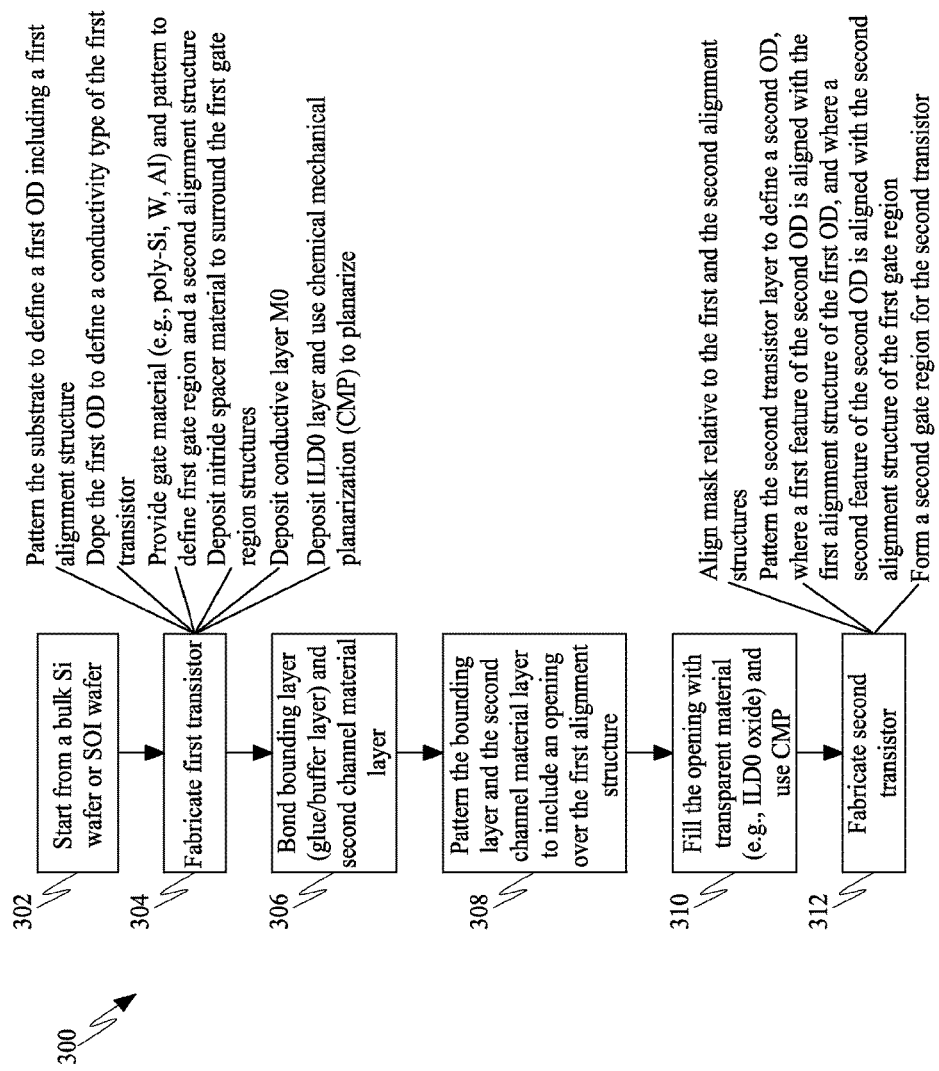
FIG. 3 depicts a flowchart illustrating an example process sequence that allows for lithography alignment between first and second transistor layers of a multi-layer semiconductor device.

FIG. 3 depicts a flowchart 300 illustrating an example process sequence that allows for lithography alignment between first and second transistor layers of a multi-layer semiconductor device. The example process of the flowchart 300 may be used, for example, to implement the box-in-box registration patterns of FIGS. 2A, 2B, and 2C for aligning the different layers of the multi-layer semiconductor device. At 302, a bulk silicon substrate or silicon-on-insulator (SOI) substrate serves as a starting point for the multi-layer semiconductor device. At 304, a first transistor is fabricated substantially over the substrate. Fabricating the first transistor may involve a number of steps, as depicted in FIG. 3. For example, the substrate may be patterned to define a first OD region (i.e., a first active/OD layer) for the first transistor. The first OD region may further include a first alignment structure, which may be, for example, a rectangular or square-shaped box (e.g., a recess may be formed in the substrate). The first alignment structure patterned in the first OD region may be used in a lithography alignment process during patterning of an overlying layer (e.g., a second transistor layer).

As part of defining the first OD region, the region of the substrate patterned to serve as the OD region may be doped to define a conductivity type (e.g., N-type or P-type) of the first transistor. The doping may be performed, for example, using an ion implantation process, among others. The materials used in the doping process may define the conductivity type. For example, if the first transistor is to operate as an n-MOSFET, arsenic or phosphorus may be used as the dopant, and if the first transistor is to operate as a p-MOSFET, boron may be used as the dopant. After doping the first OD region, a gate material (e.g., polysilicon, tungsten, aluminum) is provided substantially over the first OD region and patterned to define a first gate region (i.e., a first gate layer). The first gate material may also be patterned at the same time to define a second alignment structure, which may be, for example, a rectangular or square-shaped box. Like the first alignment structure, the second alignment structure patterned in the first gate region may be used in a lithography alignment process during patterning of an overlying layer (e.g., a second transistor layer).

Nitride material may be deposited and etched to form the spacer and cover the sidewalls of the structures (e.g., gate stack structures) of the first gate region. An interlayer dielectric ILD0 layer may next be deposited substantially over the structure and planarized via a chemical mechanical polishing (CMP) process. Next, photo-lithography and contact trench etching using an M0 mask may be performed, and the contact trench may be filled by a conductive M0 material (e.g., W, Cu), where the conductive material M0 may be used to form source and drain electrode structures. Further planarizing (e.g., via a CMP process) may be done, and the planarized surface may include portions of the ILD0 layer, the conductive layer M0, the nitride spacer material, and the first gate region. At 306, a bounding medium layer and a second channel material layer may be bonded to the planarized surface. The bounding layer, bonded substantially over the planarized surface may include a glue material (e.g., ILD0 oxide) and may function as a buffer layer between the first transistor and a second transistor fabricated over the first transistor. The second channel material layer may form a portion of the second transistor, where additional features are fabricated over the second channel material layer to form various regions (e.g., drain, gate, source, etc.) of the second transistor.

At 308, the bounding layer may be patterned to define an opening or openings substantially over the first alignment structure. As described above, the first and the second alignment structures may be fabricated in the first OD region and the first gate region, respectively, of the first transistor that underlies the bounding layer. The second channel material layer may also be patterned in a manner similar to that of the first channel material layer (i.e., first OD layer), such that the patterned second channel material layer also includes an overlap box structure over the first and the second alignment structures. The openings formed in the bounding layer and the second channel material may allow the first and the second alignment structures to be visible during fabrication of the second transistor, as described below. At 310, the openings in the bounding layer and the second channel material layer may be filled with transparent or semi-transparent material (e.g., interlayer dielectric ILD0 oxide material), and a second planarized surface may thereafter be formed using CMP. The second planarized surface may include portions of the transparent or semi-transparent material used to fill the openings and portions of the second channel material layer deposited over the bounding layer.

At 312, a second transistor is fabricated substantially over the second planarized surface. The second transistor may be patterned using a mask layer, where the mask layer includes structures that are aligned relative to the first and the second alignment structures formed in the first transistor. In the example of FIG. 3, the second transistor layer is patterned to define a second OD region including a first feature and a second feature. The first feature of the second OD region may be aligned with the first alignment structure of the first OD Region, and the second feature of the second OD region may be aligned with the second alignment structure of the first gate region. Additional steps may be used in fabricating the second transistor including, for example, forming a second gate region for the second transistor.

Figure 4B:
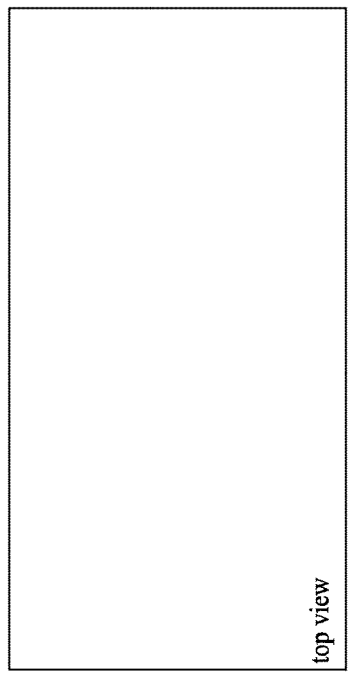
FIGS. 4A, 4B, and 4C depict a bulk silicon substrate used as a starting point in the fabrication process of a multi-layer semiconductor structure.
Figure 4C:
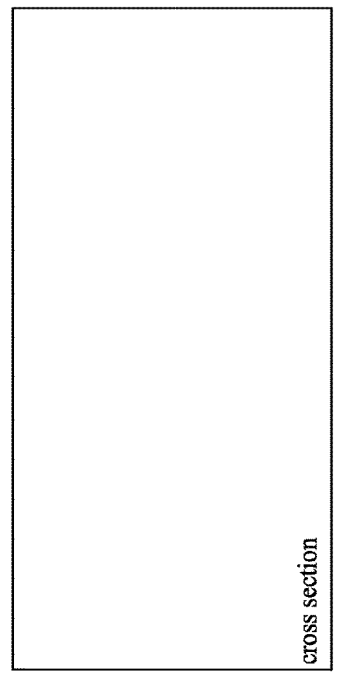
Figure 4A:
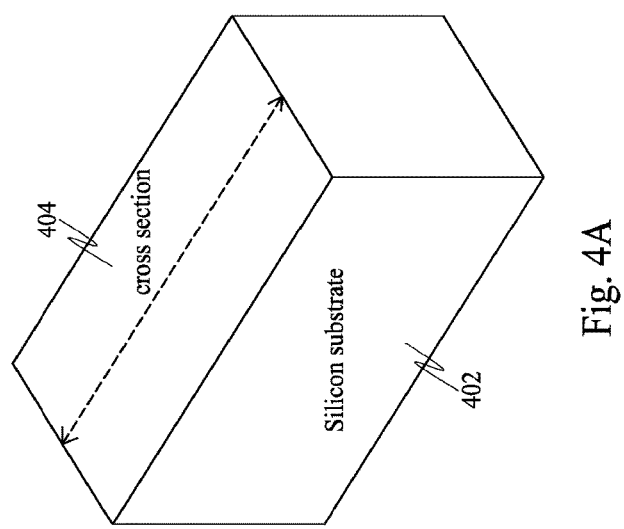

The steps of flowchart 300 are described in greater detail with reference to FIGS. 4A-15C. FIGS. 4A, 4B, and 4C depict a bulk silicon substrate 402 used as a starting point in the fabrication process of a multi-layer semiconductor structure. In FIG. 4A, a cross-sectional slice 404 of the bulk silicon substrate 402 is depicted, and in FIG. 4C, a cross-sectional view depicts the structure along the slice 404. The cross-sectional slice 404 may be, for example, defined along a "fin" of the multi-layer semiconductor structure (e.g., if the multi-layer semiconductor structure is a FinFET, the cross-sectional slice 404 may be along the conducting channel of the structure, which is wrapped by a thin silicon "fin"). FIG. 4B depicts a top view of the silicon substrate 402 (i.e., with the "z" axis of the silicon substrate 402 being perpendicular to the plane of the paper).

FIGS. 5A, 5B, and 5C depict structures 502, 504 etched into a substrate 506. As explained in further detail below, the structures 502, 504 may comprise portions of a first OD region (i.e., a first active layer, such as an OD fin structure) of a first transistor defined in a multi-layer semiconductor structure.

Figure 6B:
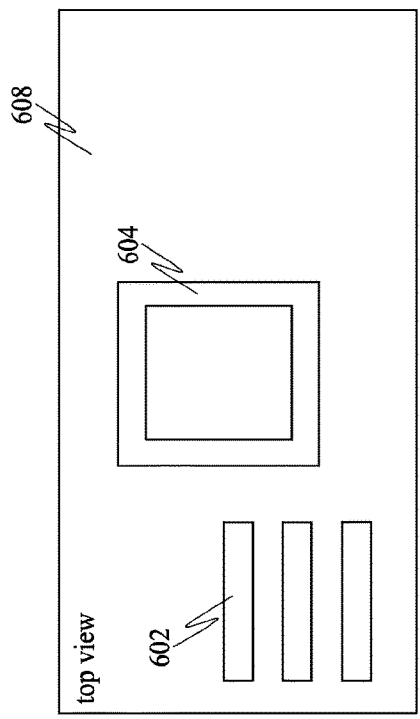
FIGS. 6A, 6B, and 6C depict portions of a first OD region of a first transistor in a multi-layer semiconductor structure.
Figure 6C:
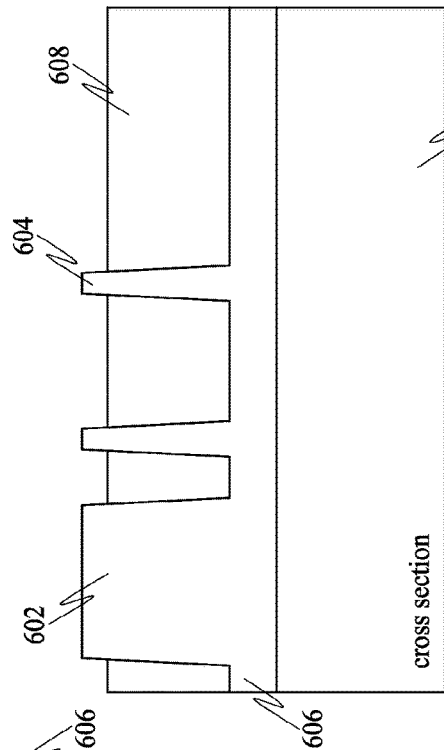
Figure 6A:
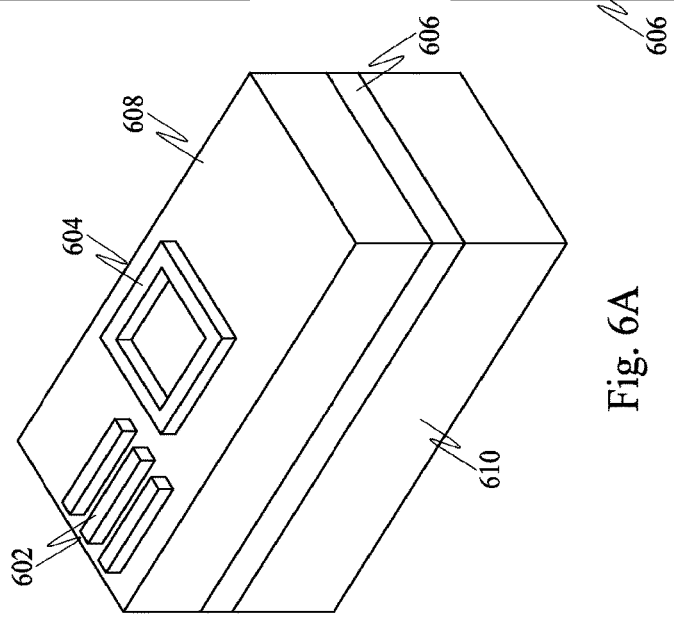

FIGS. 6A, 6B, and 6C depict portions 602, 604, 606 of a first OD region (i.e., a first active layer) of a first transistor in a multi-layer semiconductor structure. The portions 602, 604, 606 of the first OD region may comprise areas of a bulk substrate 610 that have been doped to define a conductivity type (e.g., P-type or N-type) of the first transistor. In one example, the portions 602, 604, 606 of the first OD region are doped via an ion implantation procedure, where n-type dopant is introduced to the second channel material to form the n-well region. The portion 602 may be used to define, for example, source/drain and gate regions of the first transistor that are formed within the first OD region. The portion 604 may define a first alignment structure of a rectangular or square shape that is used in aligning features of layers deposited over the first OD region (e.g., layers in which a second transistor is defined). The portion 606 may define a channel of the first OD region. An isolation oxide 608 may be deposited substantially over the structure, such that only upper portions of the first OD region are present at a surface of the isolation oxide 608.

FIGS. 7A, 7B, and 7C depict portions 702, 704 of a first gate region (e.g., a first gate layer that includes suitable materials, such as an underlying hi-K gate dielectric material and an overlying metal gate material) of a first transistor in a multi-layer semiconductor structure. The portions 702, 704 of the first gate region may comprise polysilicon, tungsten, aluminum, or other conductive materials. The portion 702 may include gate stacks that are deposited substantially over portions 710 of a first OD region, as depicted in FIG. 7. The gate stacks of the portion 702 may include an interfacial layer (IL) and a high-k (HK) dielectric layer 708, over which the polysilicon, tungsten, aluminum, or other material making up the first gate region is deposited. The portion 704 may define a second alignment structure of a rectangular or square shape that is used in aligning features of layers deposited substantially over the first transistor (e.g., layers in which a second transistor is defined). As depicted in FIG. 7, the multi-layer semiconductor structure may have two alignment structures 704, 706 defined within the first transistor, where the first alignment structure 706 is formed by patterning and etching the first OD material at the same time that the first OD region of the first transistor (in the main circuit) is patterned, and the second alignment structure 704 is defined at the same time that the first gate region of the first transistor (in the main circuit) is defined by patterning and etching the first gate material.

Figure 8B:
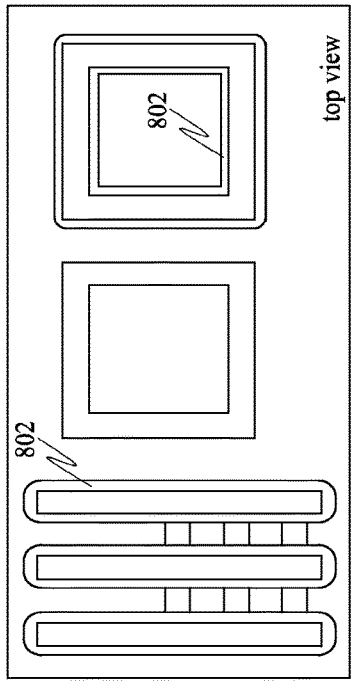
FIGS. 8A, 8B, and 8C depict a spacer material that is deposited and etched to form the sidewalls of gate stacks of a first gate region.
Figure 8C:
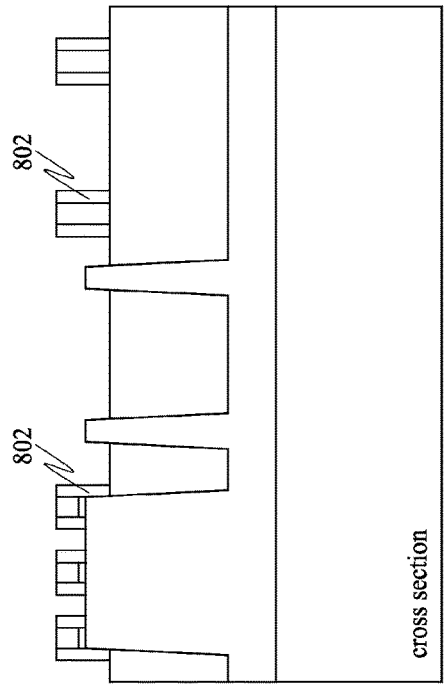
Figure 8A:
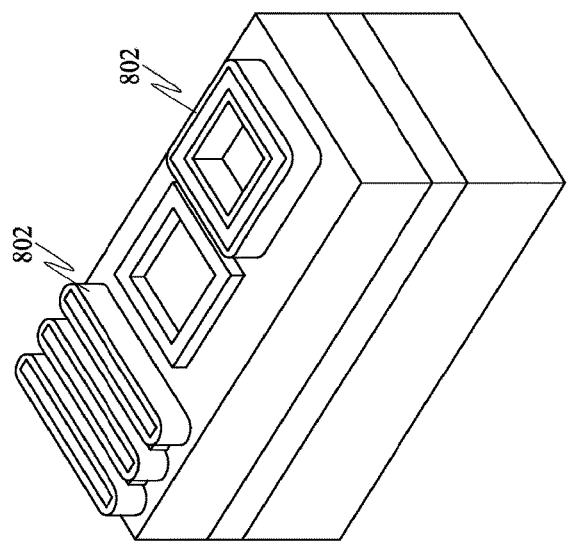

FIGS. 8A, 8B, and 8C depict a spacer material 802 that is deposited and etched to form the sidewalls of gate stacks of a first gate region. The spacer materially 802, typically comprised of a nitride (e.g., silicon nitride), an oxide, or a combination thereof, may be used to maintain integrity of the gate stacks or other portions of the semiconductor structure during the fabrication process (e.g., to reduce interaction with aggressive chemicals that may be used in further processing).

Figure 9B:
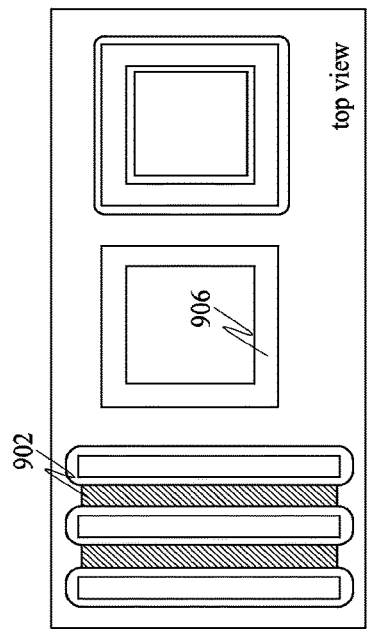
FIGS. 9A, 9B, and 9C depict a first conductive layer M0 of a first transistor in a multi-layer semiconductor structure.
Figure 9C:
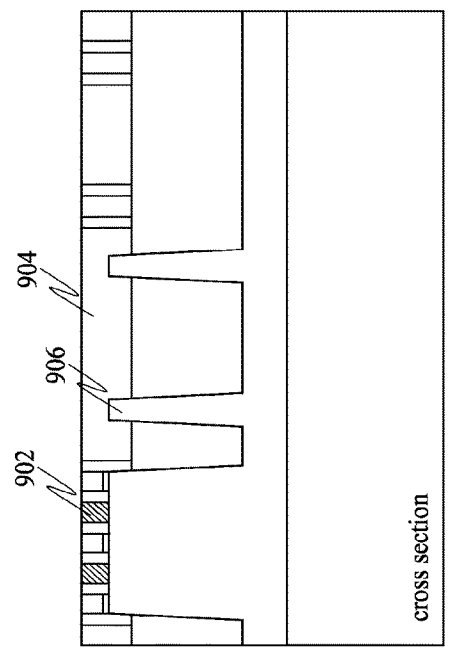
Figure 9A:
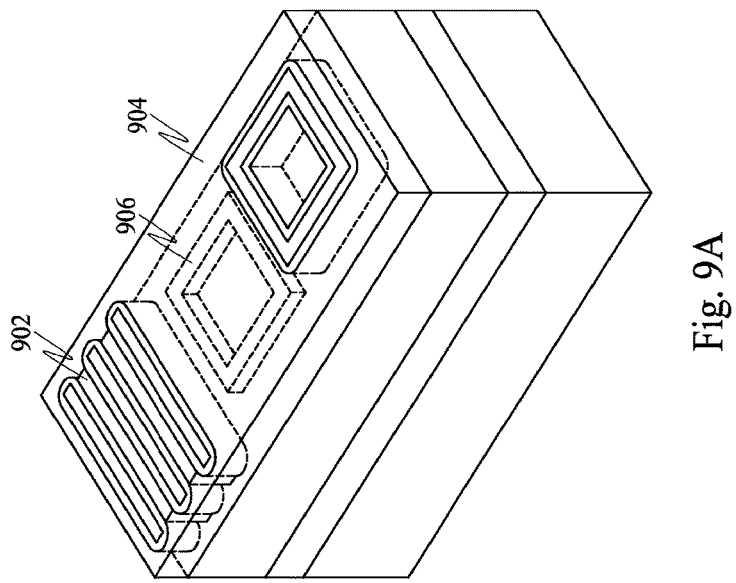

FIGS. 9A, 9B, and 9C depict a first conductive layer M0 902 of a first transistor in a multi-layer semiconductor structure. The first conductive layer M0 902 may be a contact material or an electrode material that is used in applying a voltage or a current to a source region or a drain region of the first transistor, for example. An interlayer dielectric ILD0 904 is deposited substantially over the structure, and the structure may thereafter be planarized (e.g., via a CMP process) to form a planarized surface (e.g., as depicted in the cross-sectional view of FIG. 9C). The interlayer dielectric ILD0 oxide 904 (e.g., BSG, PSG, BPSG and flowable-CVD oxide) may be transparent or partially transparent to the overlap measurement system (e.g., the measurement system includes a radiation source having wavelength within a range of approximately 157 nm to 740 nm), such that an alignment structure 906 of a first OD region of the first transistor may be visible or detectable by the overlap measurement system through the interlayer dielectric ILD0 904.

Figure 10B:
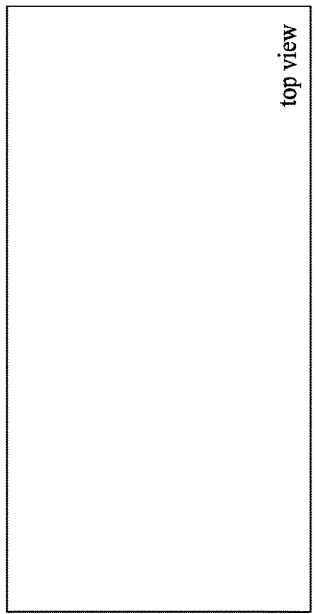
FIGS. 10A, 10B, and 10C depict a second channel material layer and a dielectric layer that are positioned over a planar surface of a first transistor layer.
Figure 10C:
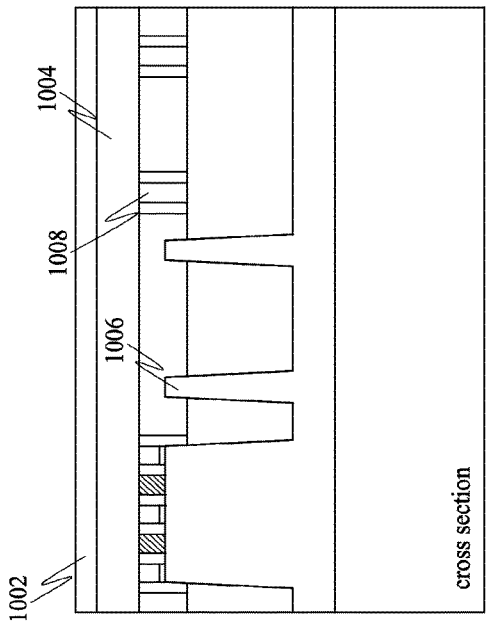
Figure 10A:
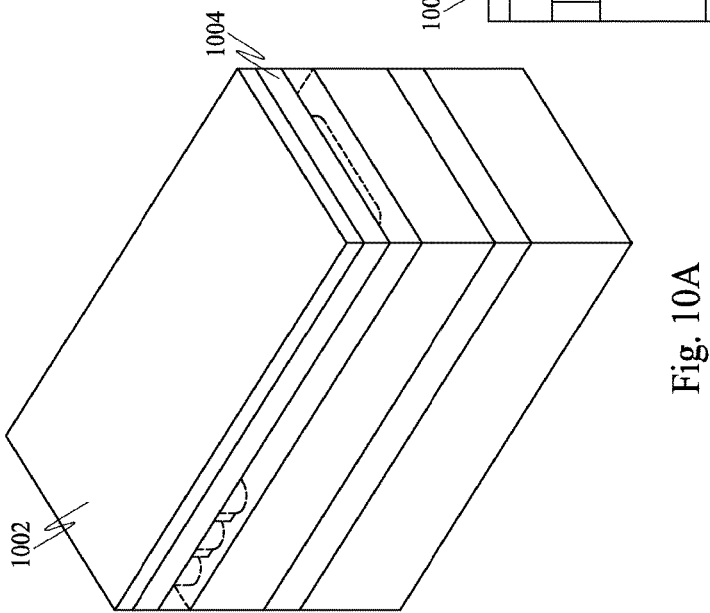

FIGS. 10A, 10B, and 10C depict a second channel material layer 1002 and a dielectric layer 1004 that are positioned substantially over a planar surface of a first transistor layer. The second channel material layer 1002 and the dielectric layer 1004 may be deposited to be flat and without any substantial topographical features. Further, due to the layer thicknesses and materials used in the second channel material layer 1002 and the dielectric layer 1004, the layers 1002, 1004 may be opaque, such that alignment structures underlying the layers 1002, 1004 may not be visible (e.g., as depicted in the top view of FIG. 10B). The second channel material layer 1002 may be used to define a channel of a second transistor, where the second transistor is fabricated above the planar surface of the first transistor layer, as described in further detail below. The second channel material layer 1002 may be comprised of, for example, silicon, germanium, gallium arsenide, silicon carbide, graphite, or another material. The dielectric layer 1004 may be a glue layer comprised of, for example, aluminum oxide (i.e., $Al_2O_3$), silicon dioxide (i.e., $SiO_2$), or hafnium oxide (i.e., $HfO_2$). The dielectric layer 1004 may comprise a bounding layer used to bond the second channel material layer 1002 of the second transistor with the planar surface of the first transistor layer.

Figure 11B:
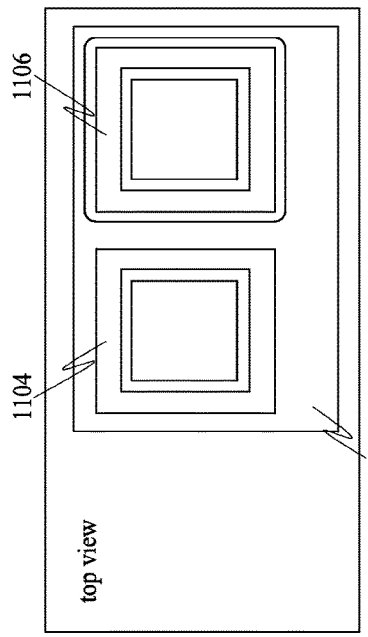
FIGS. 11A, 11B, and 11C depict a patterning of a second channel material layer and a dielectric layer to define an opening in the layers.
Figure 11C:
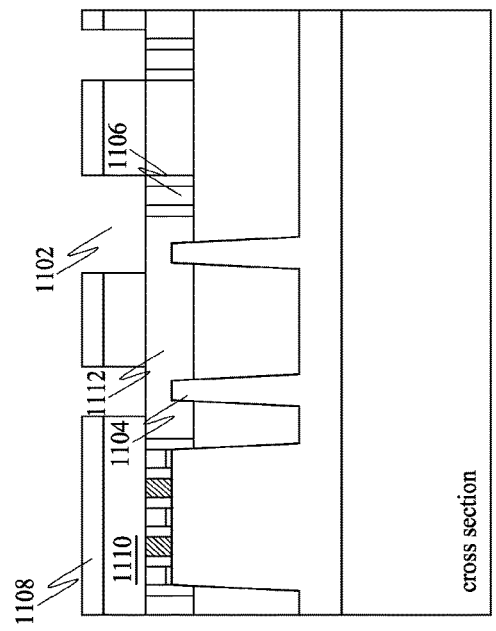
Figure 11A:
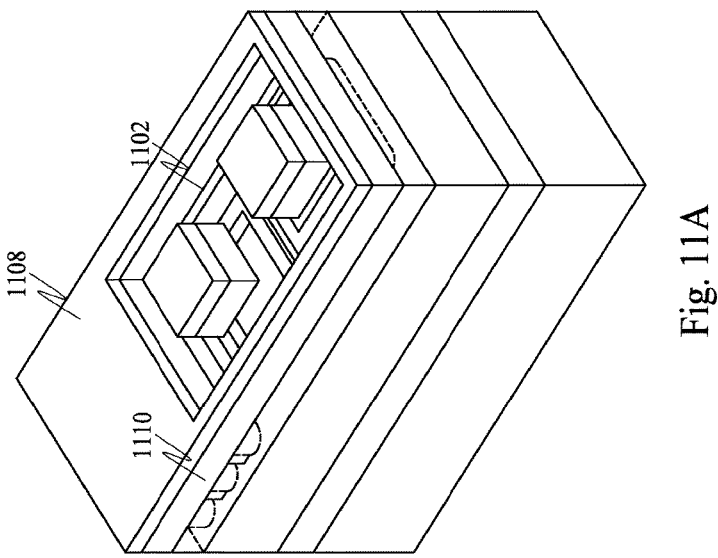

FIGS. 11A, 11B, and 11C depict a patterning of a second channel material layer 1108 and a dielectric layer 1110 to define an opening 1102 in the layers 1108, 1110. The opening defined in the layers 1108, 1110 may be aligned to be directly above alignment structures 1104, 1106, thus allowing the alignment structures 1104, 1106 to be visible via the opening 1102 during fabrication of a second transistor over the layers 1108, 1110. The alignment structure 1106, defined in a first gate region of a first transistor underlying the layers 1108, 1110, is exposed when the opening 1102 is etched. The alignment structure 1104, defined in a first OD region of the first transistor, is formed beneath a partially transparent interlayer dielectric ILD 1112, such that the alignment structure 1104 is also visible via the opening 1102. A mask used in etching the opening 1102 may include dimensions on the range of several micrometers. In some embodiments, the alignment structure may be designed to allow the opening region 1102 to have a relaxed alignment requirement (e.g., several micrometers), where the alignment requirement is relaxed in comparison to the alignment requirement for the features in the main circuit (e.g., smaller than ten nanometers).

Figure 12B:
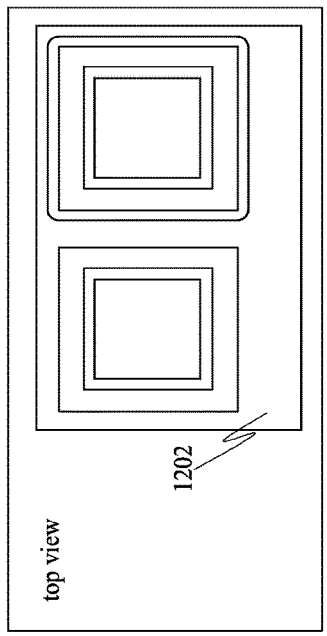
FIGS. 12A, 12B, and 12C depict a transparent material used to fill an opening that is defined in a second channel material layer and a dielectric layer.
Figure 12C:
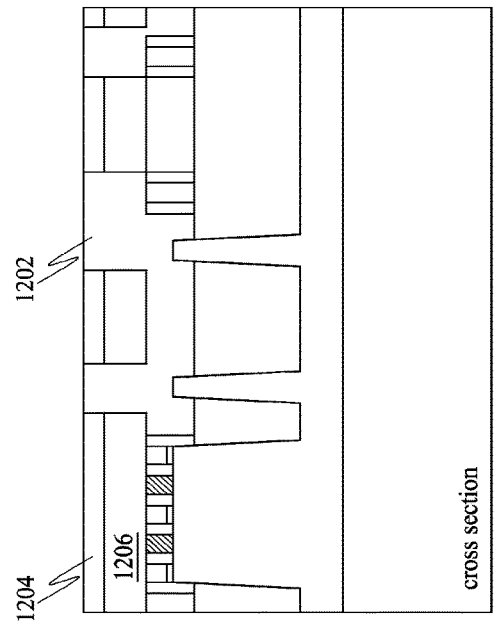
Figure 12A:
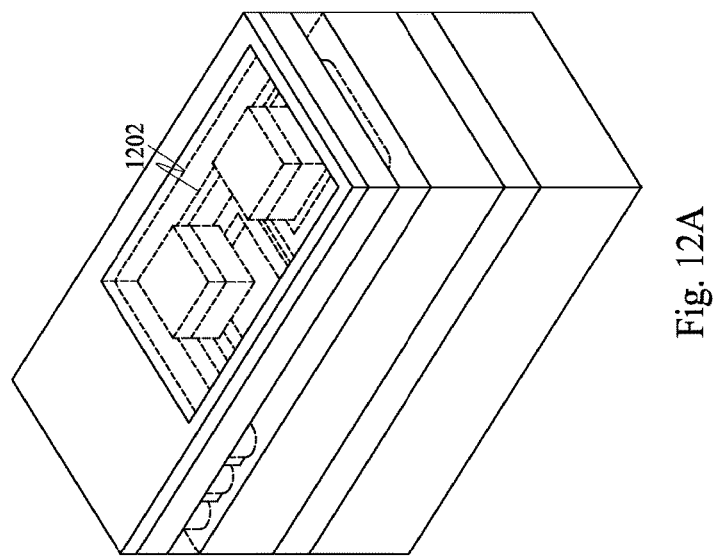

FIGS. 12A, 12B, and 12C depict a transparent material 1202 used to fill an opening that is defined in a second channel material layer 1204 and a dielectric layer 1206. The transparent material 1202 used to fill the opening may be, for example, an interlayer dielectric material ILD0.

Figure 13A:
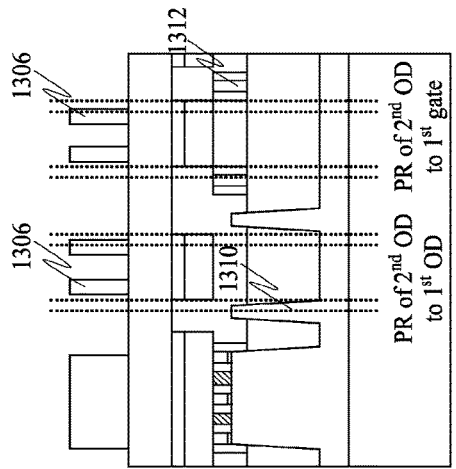
FIGS. 13A, 13B, 13C, and 13D depict steps used in performing an alignment check during a patterning of a second transistor structure over an underlying first transistor structure, where features of a BARC layer are used as a mask in the patterning.

FIGS. 13A, 13B, 13C, and 13D depict steps used in performing an alignment check during a patterning of a second transistor structure over an underlying first transistor structure, where features of a BARC layer are used as a mask in the patterning. In FIG. 13A, a bottom anti-reflective coating (BARC) layer 1304 may be deposited on a planar surface of the structure, and a photoresist layer 1302 may be deposited substantially over the BARC layer 1304. Generally, the BARC layer 1304 and the photoresist layer 1302 may be partially transparent to the alignment measurement system, such that first and second alignment features 1310, 1312 may be visible despite the features 1310, 1312 being covered by the layers 1302, 1304. The first alignment feature 1310 may be defined in a first OD region of the first transistor structure, and the second alignment feature 1312 may be defined in a first gate region of the first transistor structure. The BARC layer 1304 and the photoresist layer 1302 may be used in patterning a second OD region of the second transistor structure.

Figure 13B:
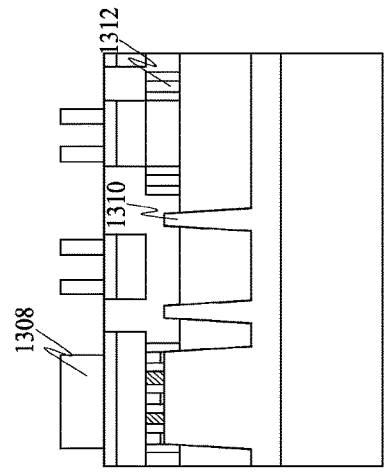
Figure 13C:
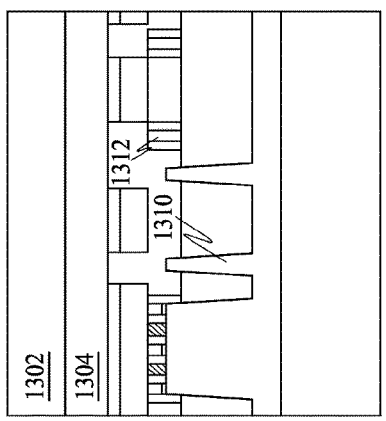
Figure 13D:
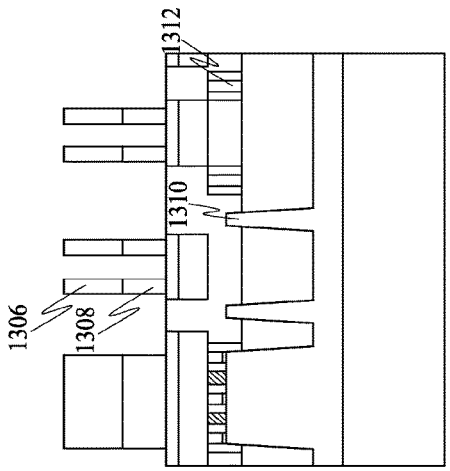

In FIG. 13B, the photoresist layer 1302 is patterned to define features 1306 in the photoresist layer 1302. The patterning of the photoresist layer 1302 may include exposure of the photoresist layer 1302 to an ultraviolet light source and development of the photoresist layer 1302 using a developer solution. As noted above, the patterning of the photoresist layer 1302 may be performed in order to pattern the second OD region of the second transistor structure. The features 1306 in the photoresist layer 1302 function as a mask layer, where the features 1306 of the mask layer are aligned relative to the first and the second alignment structures 1310, 1312. The alignment of the features 1306 in the photoresist layer 1302 is depicted in FIG. 13B, where the features 1306 are aligned relative to the first alignment structure 1310 of the first OD region, and where the features 1306 are also aligned relative to the second alignment structure 1312 of the first gate region. After development of the features 1306, an alignment check may be performed to ensure that the features 1306 are properly aligned relative to the first and the second alignment structures 1310, 1312. In FIG. 13C, the BARC layer 1304 is etched to define features 1308 in the BARC layer 1304, where the features 1306 of the photoresist layer 1302 are used as a mask in the etching. In FIG. 13D, remaining portions of the photoresist layer 1302 are removed. Further, if the result of the alignment check in FIG. 13B is determined to be unacceptable, the photoresist and BARC may be removed, and the step of FIG. 13A may be performed again before continuing the step of FIG. 13C.

Figure 14B:
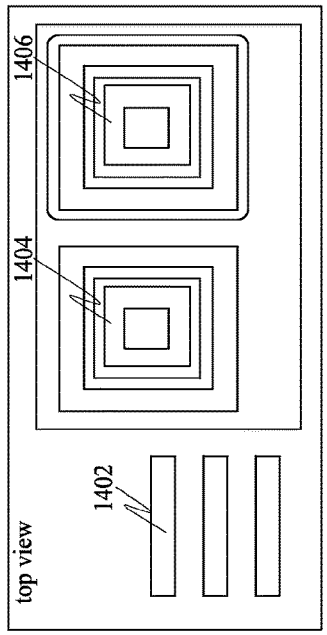
FIGS. 14A, 14B, and 14C depict patterning of a second OD region.
Figure 14C:
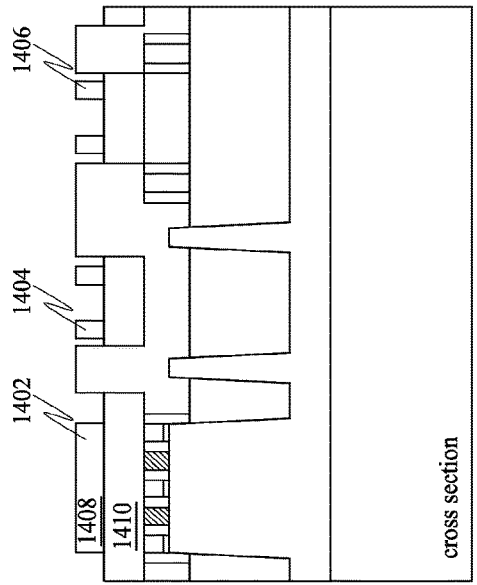
Figure 14A:
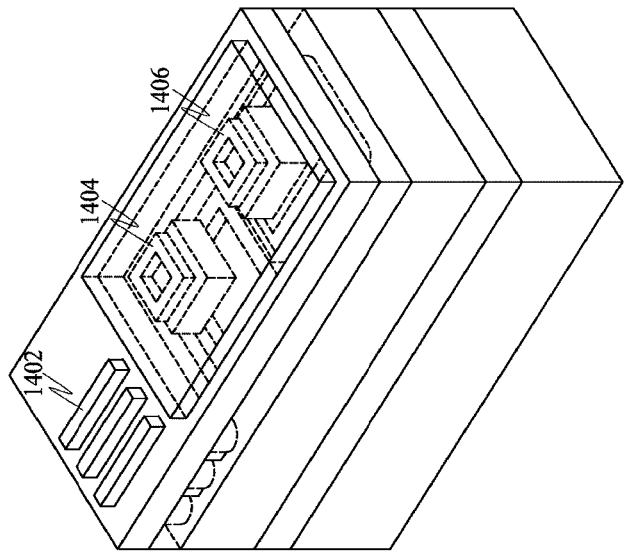

FIGS. 14A, 14B, and 14C depict patterning of a second OD region. Features 1402, 1404, 1406 of the second OD region are defined by etching a second channel material layer 1408 located over a dielectric layer 1410, where the second channel material layer is masked by the features of the BARC layer. The remaining portions of the BARC layer are removed after the etching of the second channel material layer 1408, as depicted in FIGS. 14A, 14B, and 14C. The feature 1402 may be used to define, for example, source/drain and channel regions of the transistor that includes the second OD region. The features 1404, 1406 may be structures of the second OD region that are aligned with first and second alignment structures of the underlying first transistor structure. The features 1404, 1406 of the second OD region and the first and second alignment structures of the underlying first transistor structure implement a box-in-box registration system, where the features 1404, 1406 define smaller boxes that are aligned within larger boxes of the first and second alignment structures. As described above, aligning the features 1404, 1406 with the first and second alignment structures of the underlying first transistor structure may help to ensure that various features of different layers of the multi-layer structure are properly aligned.

Figure 15B:
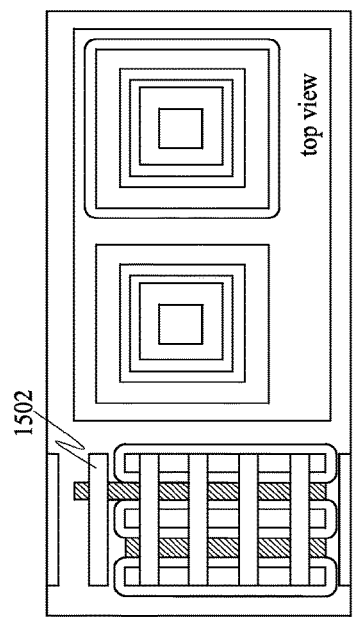
FIGS. 15A, 15B, and 15C depict a semiconductor device structure with a conductive layer M1 defined above a second device layer.
Figure 15C:
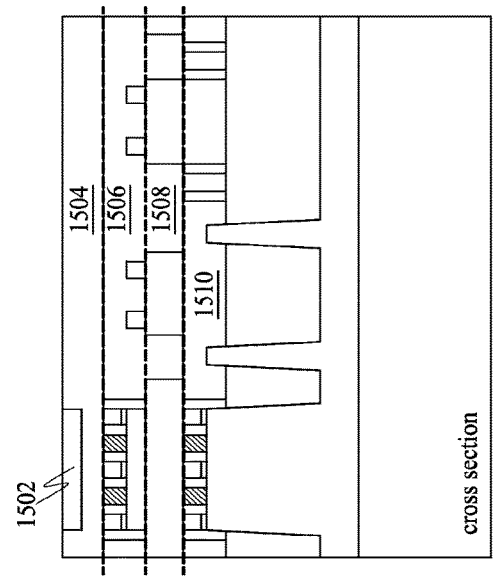
Figure 15A:
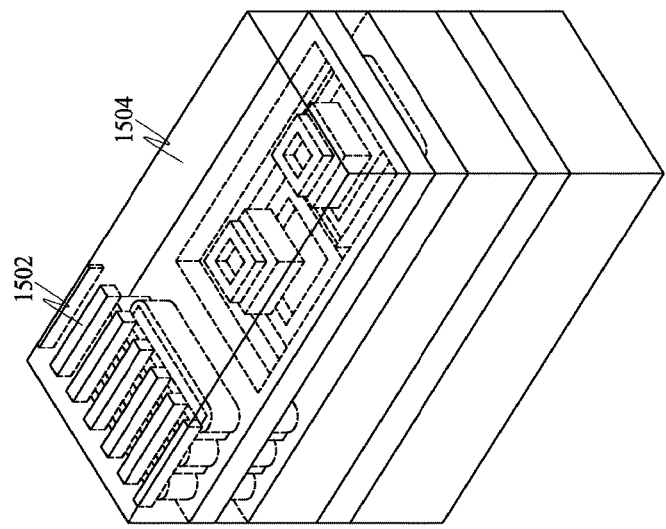

FIGS. 15A, 15B, and 15C depict a semiconductor device structure with a conductive layer M1 1502 defined above a second device layer 1506. In FIG. 15C, layer 1510 may comprise a first device layer formed substantially over a substrate and may include a first semiconductor device (e.g., a first transistor structure). The first semiconductor device defined in the first device layer 1510 includes first and second alignment structures (e.g., rectangular or square-shaped boxes that are used in patterning upper layers of the multi-layer structure) that are defined in a first OD region and a first gate region of the first semiconductor device, respectively. The layer 1510 also includes a first conductive M0 layer and a partially transparent interlayer dielectric material ILD0 layer that separates the features of the first semiconductor device within the first device layer 1510. Layer 1508 includes a dielectric material (e.g., glue layer) that separates the first device layer 1510 and the second device layer 1506. The layer 1508 further includes transparent filling material (e.g., ILD0 oxide material) that separates the features of the dielectric material.

In FIG. 15C, the second device layer 1506 may be formed substantially over the dielectric material and the transparent filling material of the layer 1508 and may include a second semiconductor device (e.g., a second transistor structure). The second semiconductor device defined in the second device layer 1506 may include a second OD region and a second gate region, where the second OD region includes features that are aligned relative to the first and the second alignment structures of the first device layer 1510. The layer 1506 also includes a second conductive M0 layer and a partially transparent interlayer dielectric material ILD0 layer that separates the features of the second semiconductor device within the second device layer 1506. Layer 1504 may include an interlayer dielectric material ILD1 layer upon which the conductive layer M1 1502 is provided.

Figure 16A:
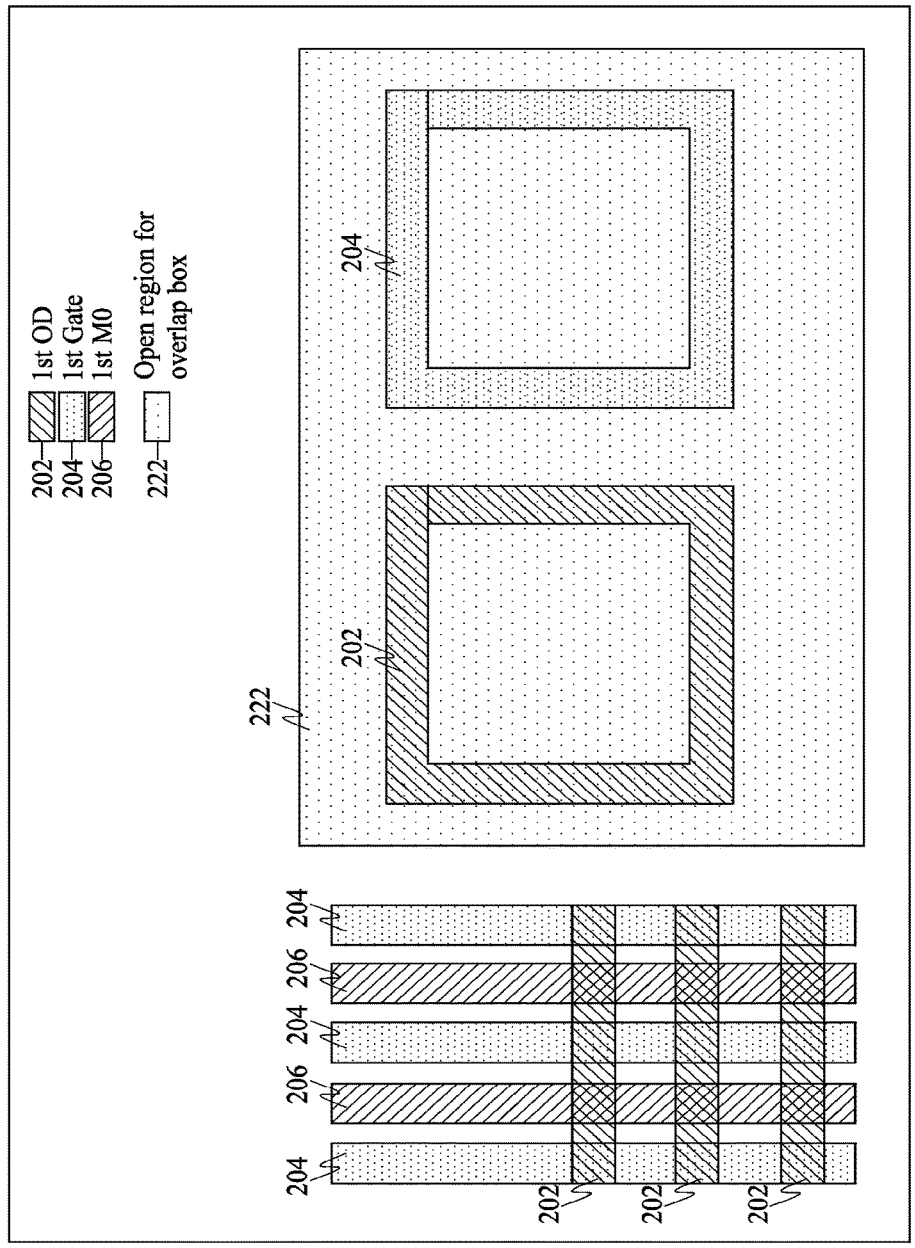
FIGS. 16A, 16B, and 16C depict a layout (or masks) of a main circuit (e.g., a logic inverter in this embodiment) and a set of overlap boxes for performing a lithography alignment check.
Figure 16B:
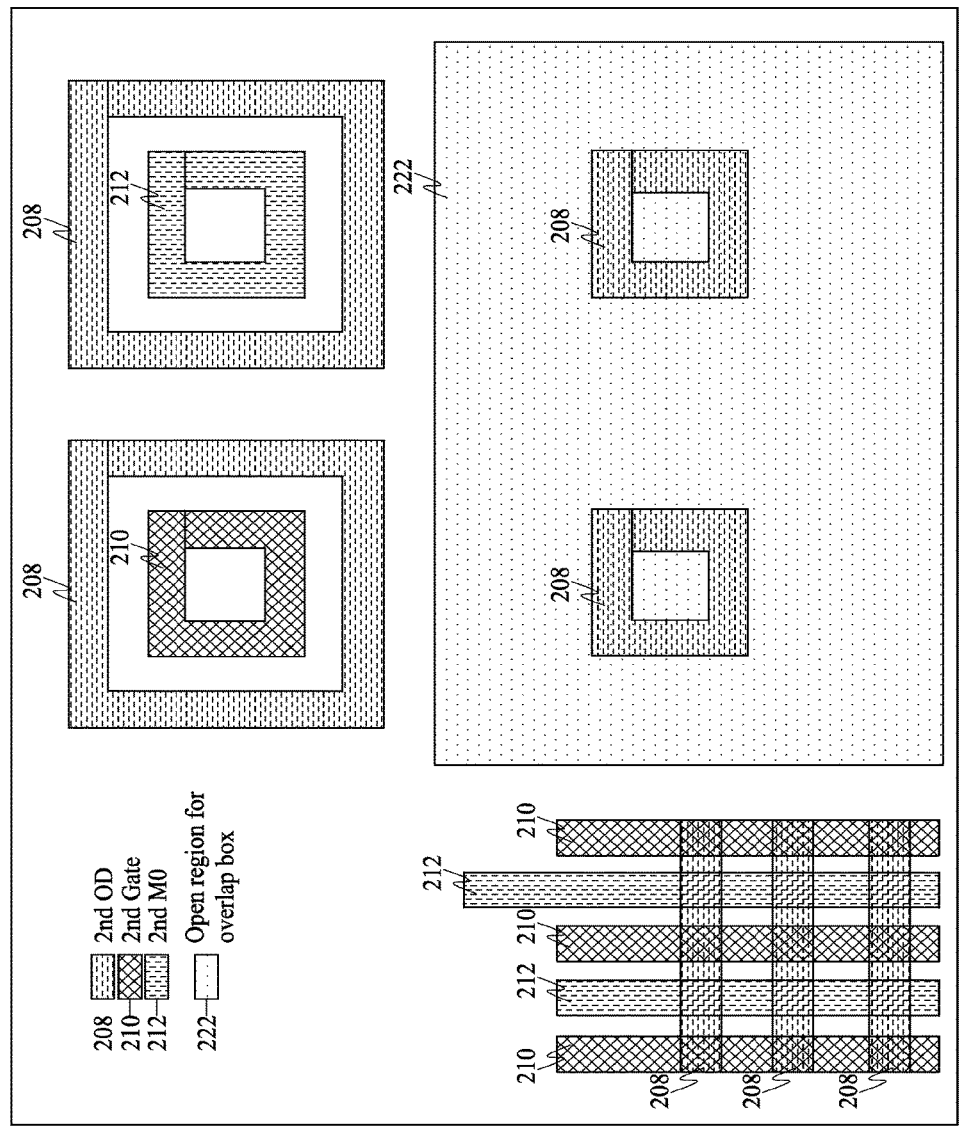
Figure 16C:
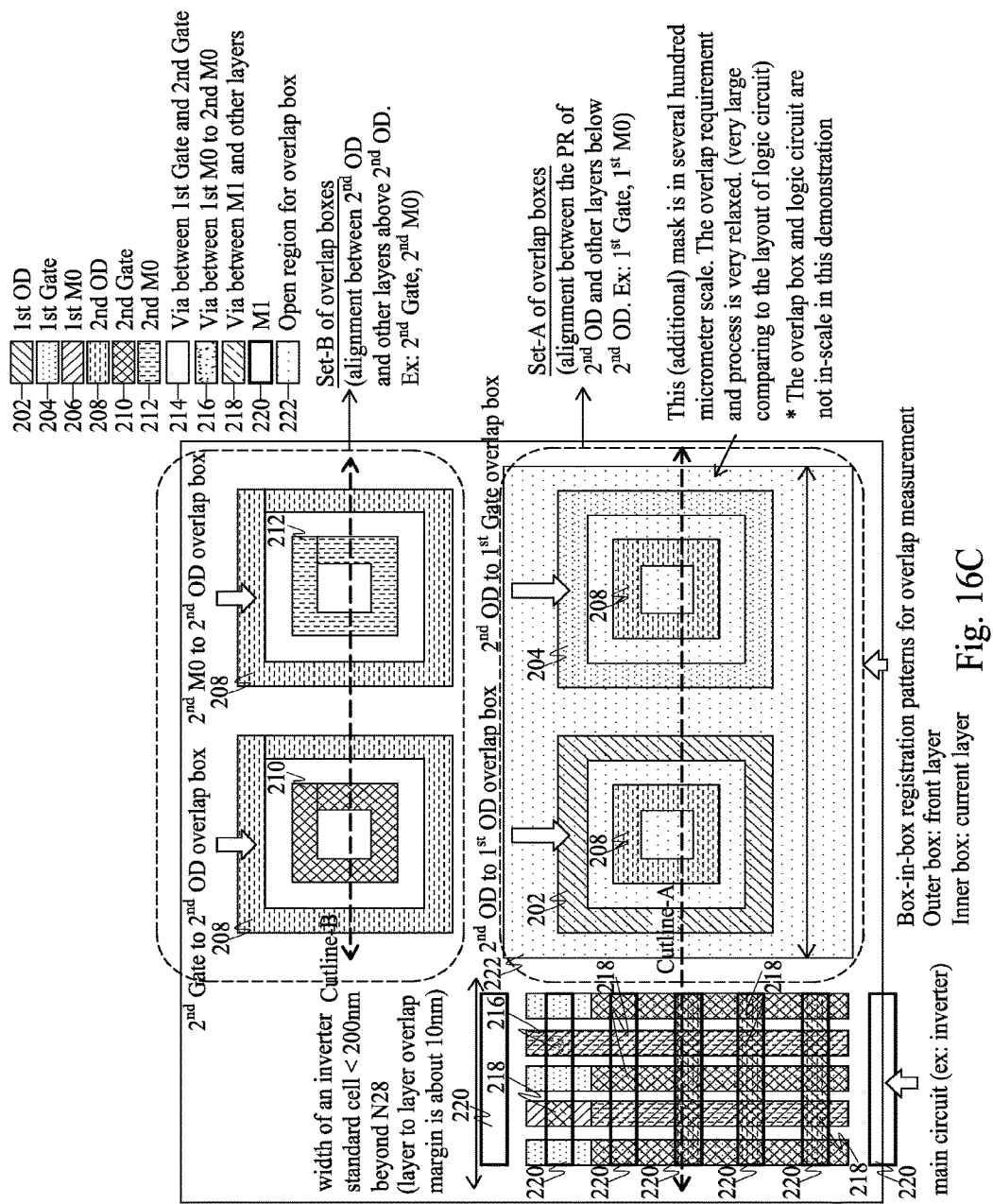

A second exemplary structure and method for lithography alignment between first and second layers of a multi-layer semiconductor device structure are illustrated in FIGS. 16A-30C. FIGS. 16A, 16B, and 16C depict a layout (or masks) of a main circuit (e.g., a logic inverter in this embodiment) and two sets of overlap boxes for performing a lithography alignment check. As depicted in FIG. 16C, the main logic circuit includes a device defined by various features of a first layer and a second layer of a multi-layer semiconductor device, where the features of the first and the second layers are aligned using a set-A of overlap boxes and a set-B of overlap boxes.

In FIGS. 16A-16C, the layout/mask may be used to define various parts of the multi-layer structure, including a $1^{st}$ OD 202, a $1^{st}$ gate 204, a $1^{st}$ M0 206, a $2^{nd}$ OD 208, a $2^{nd}$ gate 210, a $2^{nd}$ M0 212, a via between the $1^{st}$ gate and the $2^{nd}$ gate 214, a via between the $1^{st}$ M0 and the $2^{nd}$ M0 216, a via between M1 and other layers 218, M1 220, and an open region for the overlap box 222. The layout/mask for a first set of related layers is depicted in FIG. 16A, and the layout/mask for a second set of related layers is depicted in FIG. 16B. From FIGS. 16A and 16B, it can be seen that the layout/mask portions for the $1^{st}$ OD 202, the $1^{st}$ gate 204, the $2^{nd}$ OD 208, the $2^{nd}$ gate 210, and the $2^{nd}$ M0 212 each include some patterns in the main logic circuit (e.g., as depicted in the leftmost portions of FIGS. 16A and 16B) and some patterns in the overlap box (e.g., as depicted in the rightmost portions of FIGS. 16A and 16B). In FIG. 16C, the first and second sets of related layers are combined to form an overall layout/mask for the main circuit and the overlap boxes. To reduce confusion, in illustrating the mask/layout of the main circuit in FIG. 16C, only additional layers added in FIG. 16C (e.g., those layers not depicted in the main circuit mask/layout of FIGS. 16A and 16B) are highlighted with reference numbers (e.g., numbers 216, 218, 220). The additional layers added in the mask/layout of the main circuit in FIG. 16C may include M1 features 220 and vias 216, 218.

As depicted in FIG. 16C, the set-A of overlap boxes may be used for aligning exposed and developed photoresist used in patterning the $2^{nd}$ OD to the layers relating to the first device such as the $1^{st}$ OD, $1^{st}$ gate, and $1^{st}$ M0. The photoresist (inner overlap box) used in patterning the $2^{nd}$ OD in set-A may be removed after processes including photoresist removal and $2^{nd}$ OD patterning. As is also depicted in FIG. 16C, the set-B of overlap boxes may be used for aligning exposed and developed photoresist of other layers in the second device layer, such as photoresist used in patterning the $2^{nd}$ gate and the $2^{nd}$ M0, to the overlap boxes defined in the $2^{nd}$ OD. As compared to the embodiment described above with reference to FIGS. 2A-15C, the embodiment of FIGS. 16A-16C may further relax the alignment requirement of the open region 222 by opening an entire region for the set-A overlap boxes. The embodiment of FIGS. 16A-16C may require i) additional layout area, and ii) the design of the set-B overlap boxes for fabricating the second device layer (e.g., whereas the additional layout area and design of the set-B overlap boxes may not be required in the embodiment of FIGS. 2A-15C).

As described above with reference to FIG. 1, the first layer of the multi-layer semiconductor device may be formed substantially over a substrate and may include a first semiconductor device (e.g., a first transistor), and the second layer of the multi-layer semiconductor device may include a second semiconductor device (e.g., a second transistor). The first and the second layers may be separated in the vertical dimension by a dielectric layer (e.g., a bounding layer including a glue material) that is opaque. To align features of the first and the second layers, an open region 222 may be defined. The opening region 222 may allow, for example, features (e.g., alignment structures) of the first layer to be visible during the patterning of the second layer. The alignment structures of the first layer may be defined by the set-A overlap boxes of the mask/layout, as depicted in FIGS. 16A, 16B, and 16C.

In the example of FIGS. 16A, 16B, and 16C, additional alignment structures may be defined in the second layer and may be used to align features within the second layer. The additional alignment structures may be defined by the set-B overlap boxes of the mask/layout, as depicted in FIGS. 16A, 16B, and 16C. Thus, the alignment features defined by the set-A overlap boxes may be used in aligning features of the second layer relative to features of the first layer. By contrast, the alignment structures defined by the set-B overlap boxes may be used in aligning certain features of the second layer relative to other features of the second layer.

Specifically, the set-A overlap boxes may allow for alignment between the photoresist used to define the $2^{nd}$ OD and various layers that are below the $2^{nd}$ OD (e.g., $1^{st}$ OD and $1^{st}$ gate of the first layer). The set-B overlap boxes may allow for alignment between features of the $2^{nd}$ OD and various layers that are above the $2^{nd}$ OD (e.g., $2^{nd}$ gate, $2^{nd}$ M0). The fabrication and use of the set-A and set-B overlap boxes are described in greater detail below. FIGS. 17-30C, described below, may include, for example, cross-sectional slices of structures, where the cross-sectional slices are located at cutline-A and cutline-B, as depicted in FIG. 16C.

Figure 17:
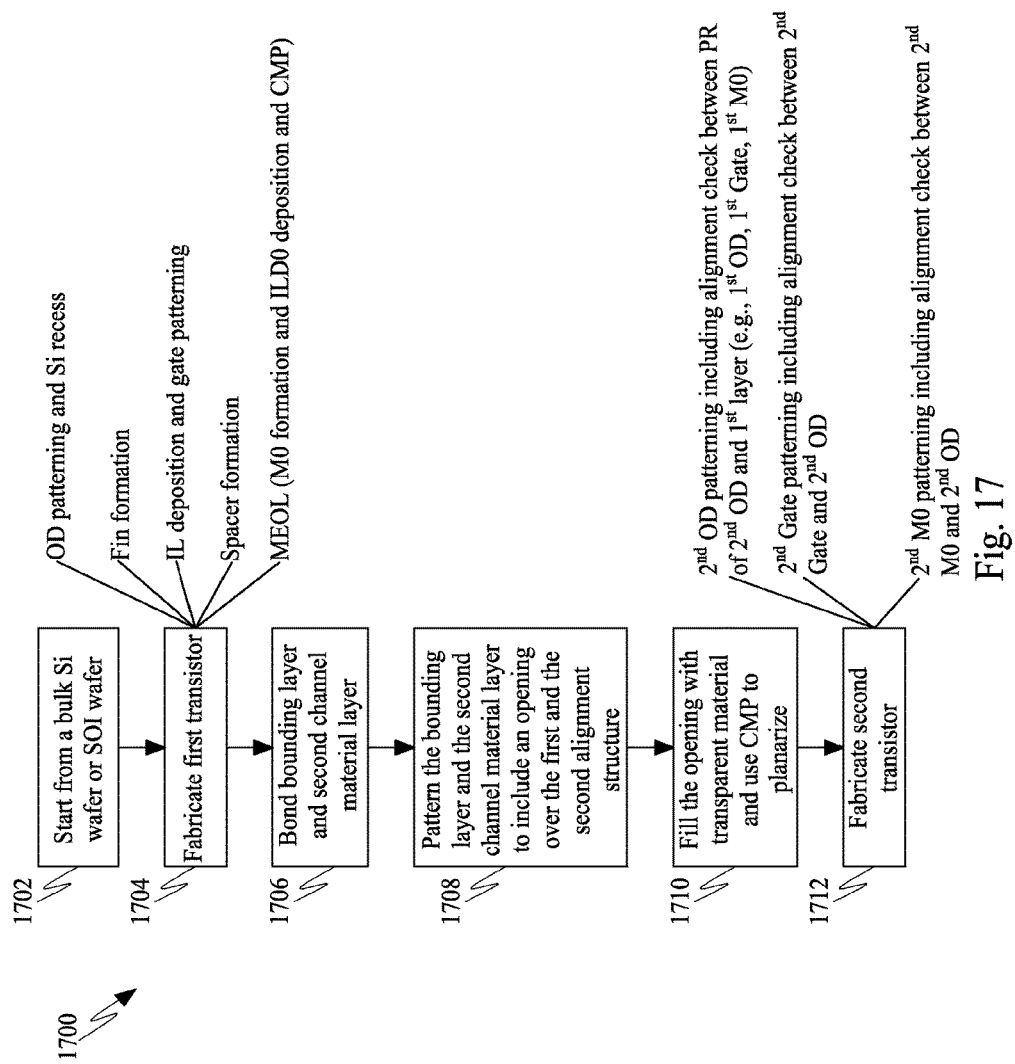
FIG. 17 depicts a flowchart illustrating an example process sequence that allows for lithography alignment between first and second transistor layers of a multi-layer semiconductor device.

FIG. 17 depicts a flowchart 1700 illustrating an example process sequence that allows for lithography alignment between first and second transistor layers of a multi-layer semiconductor device. The example process of the flowchart 1700 may be used, for example, to implement the box-in-box registration patterns of FIGS. 16A, 16B, and 16C for aligning the different layers of the multi-layer semiconductor device. At 1702, a bulk silicon substrate or silicon-on-insulator (SOI) substrate serves as a starting point for the multi-layer semiconductor device.

At 1704, a first transistor is fabricated substantially over the substrate. Fabricating the first transistor may involve a number of steps, as depicted in FIG. 17. For example, the substrate may be patterned to define a first OD region (i.e., a first active region) for the first transistor. The first OD region may further include a first alignment structure. The first alignment structure patterned in the first OD region may be used in a lithography alignment process during patterning of an overlying layer (e.g., a second transistor layer). The first transistor may be fabricated as a multigate transistor (e.g., a FinFET transistor that is a non-planar, double-gate or tri-gate transistor), where a conducting channel of the transistor is wrapped by a thin, silicon "fin" that forms the body of the device. After forming the fin of the transistor, an isolation oxide may be deposited, and a first gate structure may be patterned substantially over the isolation oxide and the first OD region. The first gate structure may include a second alignment structure. Nitride spacer material may be deposited and etched using a dry-etch technique to form sidewalls of gate stacks of the first gate structure. An interlayer dielectric ILD0 may be deposited and planarized by a chemical mechanical planarization (CMP) process. Next, a conductive M0 region may be formed by patterning and etching the ILD0 oxide and filling conductive materials over the source/drain region of the first OD region.

At 1706, a bounding layer (e.g., a bonding layer including a glue material that acts as a buffer layer to link the ILD0 oxide of the first transistor layer and second channel material), and a second channel material layer are bonded substantially over the first transistor. At 1708, the bounding layer and the second channel material layer are patterned to include an opening substantially over the first and the second alignment structures. At 1710, the opening is filled with transparent material (e.g., interlayer ILD0 oxide material) and a CMP process is used to planarize the structure. At 1712, a second transistor is fabricated substantially over the planarized structure.

As illustrated in FIG. 17, the fabrication of the second transistor may include a number of alignment steps. For example, patterning of a second OD region of the second transistor may include performing an alignment check between a photoresist mask layer used in fabricating the second OD region and a feature defined in a portion of the first transistor (e.g., a feature defined in the first OD region, the first gate structure, or a first M0 region of the first transistor). Patterning a second gate structure of the second transistor may include performing an alignment check between a photoresist mask layer used in fabricating the second gate region and a first feature of the second OD region. Patterning a second M0 region of the second transistor may include performing an alignment check between a photoresist mask layer used in fabricating the second M0 region and a second feature of the second OD region.

The steps of flowchart 1700 are described in greater detail with reference to FIGS. 18A-30C. Initial process steps of the second exemplary method for lithography alignment described with reference to FIGS. 16-30C are substantially similar to those of the first exemplary method for lithography alignment described above (e.g., the process steps illustrated in FIGS. 4A-9C). In the interest of reducing redundancy, FIGS. 4A-9C and the accompanying description herein may be referred to with regard to the initial process steps of the second exemplary method.

FIGS. 18A, 18B, and 18C depict a second channel material layer 1802 and a dielectric layer 1804 that are deposited substantially over a planar surface of a first transistor layer. The second channel material layer 1802 and the dielectric layer 1804 may be deposited to be flat, without any substantial topographical features. Further, due to the layer thicknesses and materials used in the second channel material layer 1802 and the dielectric layer 1804, the layers 1802, 1804 may be opaque (e.g., as illustrated in the top view of FIG. 18B). The second channel material layer 1802 may be used to define a channel of a second transistor, where the second transistor is fabricated above the planar surface of the first transistor layer. The second channel material layer 1802 may be comprised of, for example, silicon, germanium, gallium arsenide, silicon carbide, graphite, or another material. The dielectric layer 1804 may be a glue layer comprised of, for example, aluminum oxide (i.e., $Al_2O_3$), silicon dioxide (i.e., $SiO_2$), or hafnium oxide (i.e., $HfO_2$). The dielectric layer 1804 may comprise a bounding layer used to bond the second channel material layer 1802 of the second transistor with the planar surface of the first transistor layer.

FIGS. 19A, 19B, and 19C depict a patterning of a second channel material layer 1908 and a dielectric layer 1910 to define an opening 1902 in the layers 1908, 1910. The opening 1902 defined in the layers 1908, 1910 is positioned directly above alignment structures 1904, 1906, thus allowing the alignment structures 1904, 1906 to be visible via the opening 1902 during fabrication of a second transistor over the layers 1908, 1910. The alignment structure 1906, defined in a first gate region of a first transistor underlying the layers 1908, 1910, is exposed when the opening 1902 is etched. The alignment structure 1904, defined in a first OD region of the first transistor, is formed beneath a partially transparent interlayer dielectric ILD0 1912, such that the alignment structure 1904 is also visible via the opening 1902. A mask used in etching the opening 1902 may include dimensions on the range of several micrometers to several hundred micrometers.

FIGS. 20A, 20B, and 20C depict a transparent material 2002 used to fill an opening that is defined in a second channel material layer 2004 and a dielectric layer 2006. The transparent material 2002 used to fill the opening may be, for example, an interlayer dielectric material ILD0.

Figure 21B:
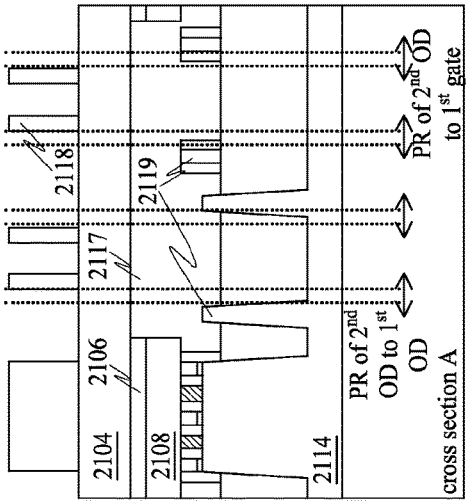
FIGS. 21A, 21B, 21C, and 21D depict steps used in performing an alignment check during a patterning of a second transistor structure over an underlying first transistor structure.
Figure 21D:
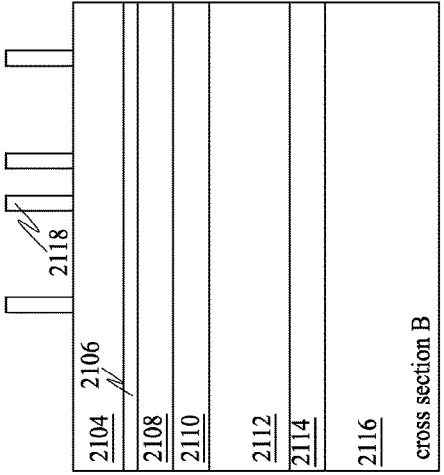
Figure 21A:
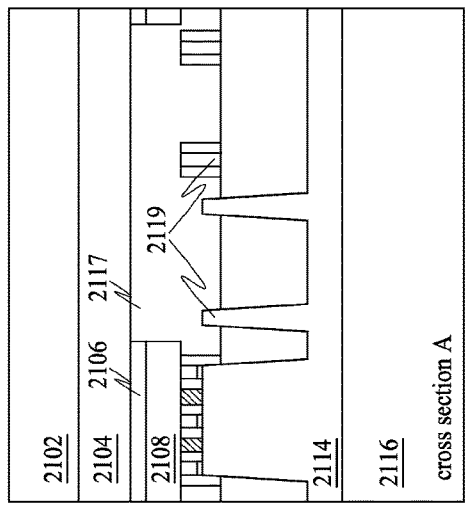
Figure 21C:
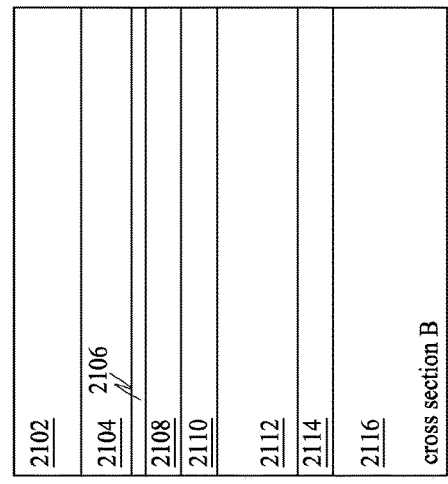

FIGS. 21A, 21B, 21C, and 21D depict steps used in performing an alignment check during a patterning of a second transistor structure over an underlying first transistor structure. FIGS. 21A and 21B depict aspects of a multi-layer semiconductor device structure at a cross section A (e.g., a first cross-sectional slice in the device structure), and FIGS. 21C and 21D depict aspects of the multi-layer semiconductor device structure at a cross section B (e.g., a second cross-sectional slice in the device structure). Cross section A and cross section B are illustrated from other perspectives in FIGS. 23A, 26A, 29A, and 30A. In FIGS. 21A and 21C, a bottom anti-reflective coating (BARC) layer 2104 may be deposited on a planar surface of the structure, and a photoresist layer 2102 may be deposited substantially over the BARC layer 2104. The BARC layer 2104 and the photoresist layer 2102 may be partially transparent, such that first and second alignment structures 2119 may be visible despite the features 2119 being covered by the layers 2102, 2104. The alignment structures 2119 may be defined in a first OD region 2114 of the first transistor structure and a first gate region of the first transistor structure. The BARC layer 2104 and the photoresist layer 2102 may be used in patterning a second OD region 2106 of the second transistor structure. Other layers of the structure include a transparent filling material 2117 (e.g., ILD0 oxide), dielectric layer 2108 (e.g., a glue layer), an ILD0 layer 2110, an isolation oxide layer 2112, and a substrate 2116.

In FIGS. 21B and 21D, the photoresist layer 2102 may be patterned to define features 2118 in the photoresist layer 2102. The patterning of the photoresist layer 2102 may include exposure of the photoresist layer 2102 to an ultraviolet light source and development of the photoresist layer 2102 using a developer solution. As noted above, the patterning of the photoresist layer 2102 may be performed in order to pattern the second OD region 2106 of the second transistor structure. The features 2118 in the photoresist layer 2102 may function as a mask layer, where the features 2118 of the mask layer are aligned relative to the alignment structures 2119. The alignment of the features 2118 in the photoresist layer 2102 is depicted in FIG. 21B, where the features 2118 are aligned relative to the first alignment structure of the first OD region 2114, and where the features 2118 are also aligned relative to the second alignment structure of the first gate region. After development of the features 2118, an alignment check may be performed to ensure that the features 2118 are properly aligned relative to the alignment structures 2119.

Figure 22A:
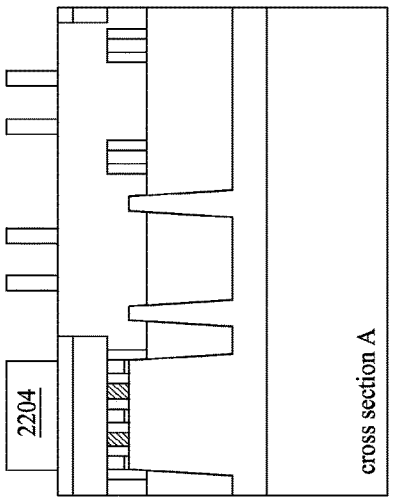
FIGS. 22A, 22B, 22C, and 22D depict patterning of a BARC layer to define features in the BARC layer.
Figure 22B:
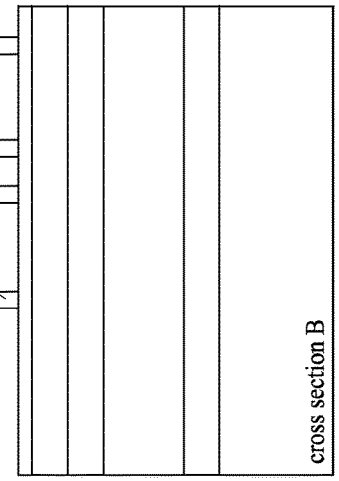
Figure 22C:
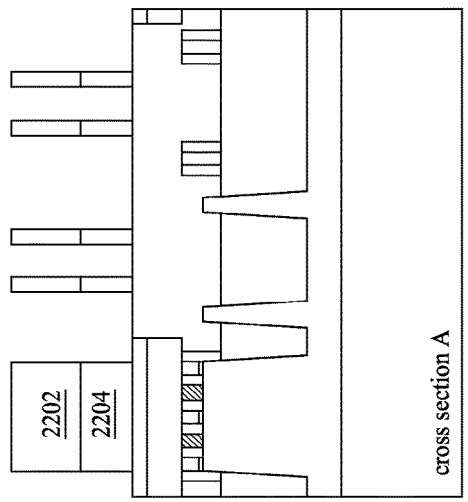
Figure 22D:
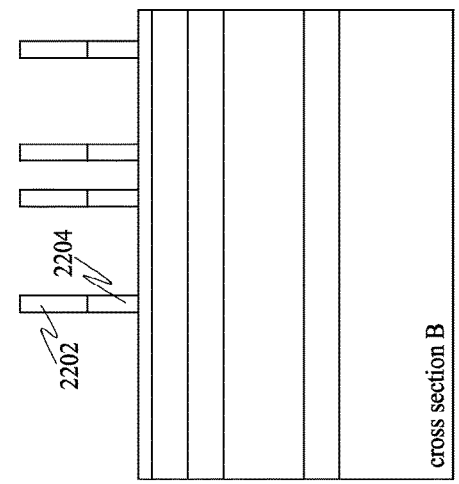

FIGS. 22A, 22B, 22C, and 22D depict patterning of a BARC layer to define features 2204 in the BARC layer. In FIGS. 22A and 22C, features 2202 of a photoresist layer substantially over the BARC layer may be used as a mask in the patterning. In FIGS. 22B and 22D, remaining portions of the photoresist layer are removed. As in FIGS. 21A, 21B, 21C, and 21D, above, features of the structure are depicted from two different cross-sectional slices A and B in FIGS. 22A, 22B, 22C, and 22D.

FIGS. 23A, 23B, and 23C depict patterning of a second OD region, where features of a BARC layer may be used as a hard mask in the patterning (e.g., the features 2204 of the BARC layer, as depicted in FIGS. 22B and 22D). FIGS. 23A and 23C depict aspects of a multi-layer semiconductor device structure at a cross section A 2304 (e.g., a first cross-sectional slice in the device structure) and at a cross section B 2302 (e.g., a second cross-sectional slice in the device structure). Features 2306, 2308 of the second OD region may be defined by etching a second channel material layer that is located over a dielectric layer 2312, where the second channel material is masked by the features of the BARC layer. The remaining portions of the BARC layer may be removed after the etching of the second channel material, as depicted in FIGS. 23A, 23B, and 23C. The feature 2306 may be used to define, for example, channel and source/drain regions of a second transistor structure that includes the second OD region.

It is noted that although the mask layer used to define the features 2306, 2308 of the second OD region may include a structure that is aligned relative to an alignment structure 2310 of an underlying first transistor structure, the second OD region in a set-A of alignment boxes may include no structures that are aligned relative to the alignment structure 2310 after removing the photoresist and patterning the second OD material. This is in contrast to the first exemplary structure and method used for lithography alignment described above with reference to FIGS. 2-15C, which includes structures in the second OD region (e.g., smaller rectangular or square-shaped features) that are aligned relative to alignment structures defined in the first transistor layer. The features 2308 in a set-B of alignment boxes may be structures of the second OD region that are used in aligning certain features of the second transistor structure relative to other features of the second transistor structure.

Figure 24A:
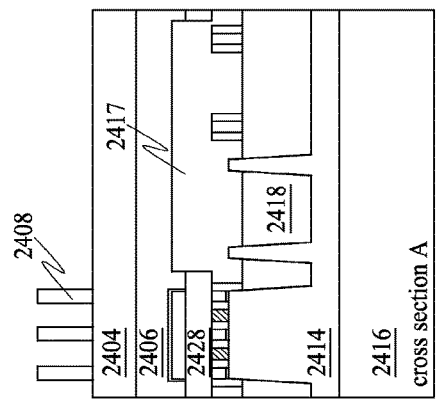
FIGS. 24A, 24B, 24C, and 24D depict steps used in patterning a second gate region of a second transistor structure.
Figure 24B:
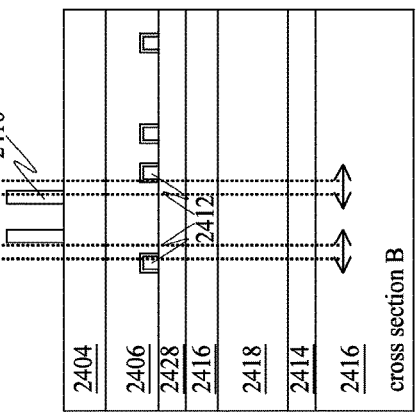
Figure 24C:
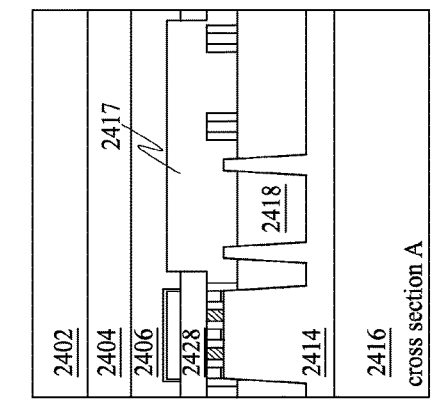

FIGS. 24A, 24B, 24C, and 24D depict steps used in patterning a second gate region 2406 of a second transistor structure. In FIGS. 24A and 24C, a bottom anti-reflective coating (BARC) layer 2404 may be deposited on the second gate region 2406, and a photoresist layer 2402 may be deposited substantially over the BARC layer 2404. The BARC layer 2404 and the photoresist layer 2402 may be partially transparent, such that alignment structures 2412 may be visible despite the features 2412 being covered by the layers 2402, 2404. The alignment structures 2412 may be defined in a second OD region of the second transistor structure. The BARC layer 2404 and the photoresist layer 2402 may be used in patterning the second gate region 2406 of the second transistor structure. Other layers of the structure include a transparent filling material 2417 (e.g., ILD0 oxide), dielectric layer 2408 (e.g., a glue layer), an ILD0 layer 2416, an isolation oxide layer 2418, a first OD region 2414, and a substrate 2416.

Figure 24D:
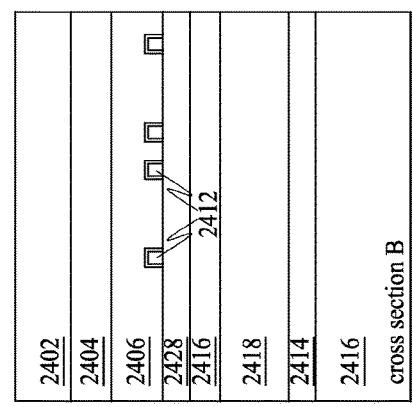

In FIGS. 24B and 24D, the photoresist layer 2402 is patterned to define features 2408, 2410 in the photoresist layer 2402. The patterning of the photoresist layer 2402 may include exposure of the photoresist layer 2402 to an ultra-violet light source and development of the photoresist layer 2402 using a developer solution. As noted above, the patterning of the photoresist layer 2402 may be performed in order to pattern the second gate region 2406 of the second transistor structure. The features 2408 in the photoresist layer 2402 function as a first hard mask, where the features 2408 may be used to define gate stacks in the material of the second gate region 2406. The features 2410 in the photoresist layer 2402 function as a second hard mask, where the features 2410 may be aligned relative to the alignment structures 2412 of the second OD region, as depicted in FIG. 24D.

Figure 25B:
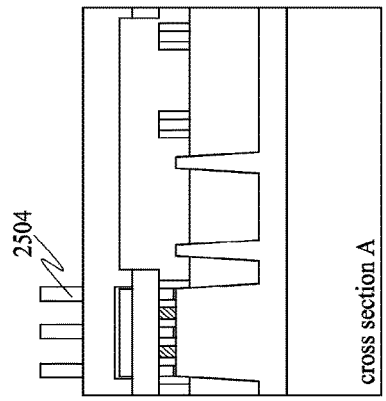
FIGS. 25A, 25B, 25C, and 25D depict patterning of a BARC layer to define features in the BARC layer.
Figure 25D:
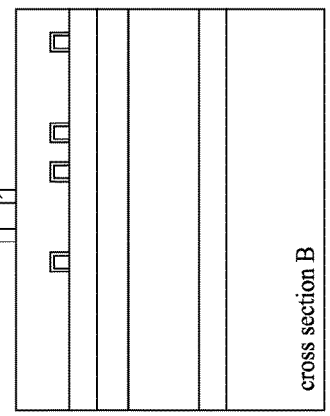
Figure 25A:
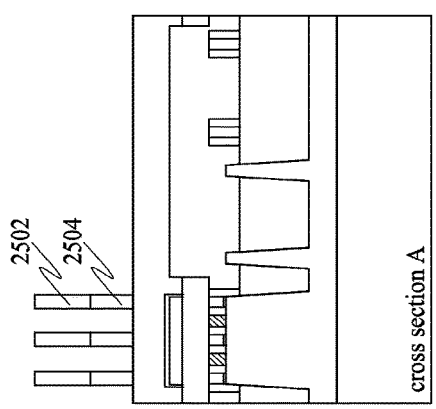
Figure 25C:
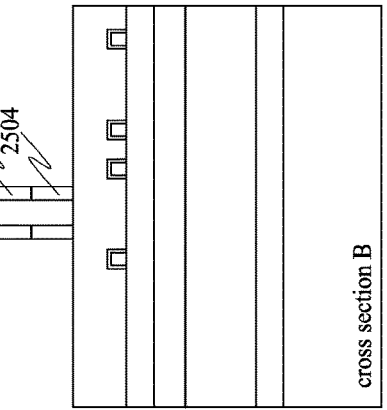

FIGS. 25A, 25B, 25C, and 25D depict patterning of a BARC layer to define features 2504 in the BARC layer. In FIGS. 25A and 25C, features 2502 of a photoresist layer substantially over the BARC layer may be used as a mask in the patterning. In FIGS. 25B and 25D, remaining portions of the photoresist layer may be removed.

FIGS. 26A, 26B, and 26C depict patterning of a second gate region, where features of a BARC layer may be used as a mask in the patterning (e.g., the features 2504 of the BARC layer, as depicted in FIGS. 25B and 25D). Features 2606, 2607 of the second gate region may be defined by etching gate material (e.g., polysilicon, etc.), where the gate material is masked by the features of the BARC layer. The remaining portions of the BARC layer are removed after the etching of the second gate material, as depicted in FIGS. 26A, 26B, and 26C. The features 2606 may be used to define, for example, gate stacks of a second transistor structure. The feature 2607 may be a structure of the second gate region that is aligned with an alignment structure 2608 of a second OD region. The feature 2607 of the second gate region and the alignment structure 2608 of the second OD region implement a box-in-box registration system, where the feature 2607 defines a smaller box that is aligned within a larger box of the alignment structure 2608. Aligning the feature 2607 with the alignment structure 2608 may help to ensure that various features of the second gate region are properly aligned with features of the second OD region and with features of other layers of the multi-layer structure.

FIGS. 27A, 27B, 27C, and 27D depict steps used in patterning a second conductive (M0) region of a second transistor structure. In FIGS. 27A and 27C, a bottom anti-reflective coating (BARC) layer 2704 may be deposited on a planar surface of the structure, and a photoresist layer 2702 may be deposited substantially over the BARC layer 2704. The planar surface may include areas comprising interlayer dielectric material ILD0 2706 and gate stacks 2728 of the second transistor structure. The BARC layer 2704 and the photoresist layer 2702 may be partially transparent, such that alignment structures 2712 may be visible despite the features 2712 being covered by the layers 2702, 2704. The alignment structures 2712 may be defined in a second OD region of the second transistor structure. The BARC layer 2704 and the photoresist layer 2702 may be used in patterning the second conductive M0 region of the second transistor structure.

In FIGS. 27B and 27D, the photoresist layer 2702 may be patterned to define features 2708, 2710 in the photoresist layer 2702. The patterning of the photoresist layer 2702 may include exposure of the photoresist layer 2702 to an ultraviolet light source and development of the photoresist layer 2702 using a developer solution. As noted above, the patterning of the photoresist layer 2702 may be performed in order to pattern the second conductive M0 region of the second transistor structure. The features 2708, 2710 in the photoresist layer 2702 function as a mask, where the features 2708, 2710 may be used to define cavities (e.g., trenches) in the interlayer dielectric material ILD0 2706 into which conductive material for the second conductive M0 region may be deposited. The features 2708, 2710 in the photoresist layer 2702 may be aligned relative to the alignment structures 2712 of the second OD region, as depicted in FIG. 27D.

FIGS. 28A, 28B, 28C, and 28D depict patterning of a BARC layer to define features 2804 in the BARC layer. In FIGS. 28A and 28C, features 2802 of a photoresist layer substantially over the BARC layer may be used as a mask in the patterning. In FIGS. 28B and 28D, remaining portions of the photoresist layer may be removed.

FIGS. 29A, 29B, and 29C depict patterning of a second conductive M0 region, where features of a BARC layer may be used as a mask in the patterning (e.g., the features 2804 of the BARC layer, as depicted in FIGS. 28B and 28D). Features 2906, 2910 of the second conductive M0 region may be defined by etching cavities in interlayer dielectric ILD0 material (e.g., ILD0 material 2706 underlying the BARC layer 2704, as depicted in FIGS. 27A, 27B, 27C, and 27D) and filling the cavities with conductive material for the second conductive M0 region, where the interlayer dielectric ILD0 material may be masked by the features of the BARC layer. The remaining portions of the BARC layer may be removed after the etching of the interlayer dielectric ILD0 material, as depicted in FIGS. 29A, 29B, and 29C. The feature 2910 may be a structure of the second conductive M0 region that is aligned with an alignment structure 2920 of a second OD region. The feature 2910 of the second conductive M0 region and the alignment structure 2920 of the second OD region implement a box-in-box registration system, where the feature 2910 defines a smaller box that is aligned within a larger box of the alignment structure 2920. Aligning the feature 2910 with the alignment structure 2920 may help to ensure that various features of the second conductive M0 region are properly aligned with features of the second OD region and with features of other layers of the multi-layer structure.

FIGS. 30A, 30B, and 30C depict a semiconductor device structure with a conductive layer M1 3002 defined above a second device layer 3014. In FIG. 30C, layer 3010 may comprise a first device layer formed substantially over a substrate and may include a first semiconductor device (e.g., a first transistor structure). The first semiconductor device defined in the first device layer 3010 may include first and second alignment structures (e.g., rectangular or square-shaped boxes that are used in patterning upper layers of the multi-layer structure) that are defined in a first OD region and a first gate region of the first semiconductor device, respectively. The layer 3010 also includes a first conductive M0 layer and a partially transparent interlayer dielectric material ILD0 layer that separates the features of the first semiconductor device within the first device layer 3010. Layer 3016 includes a dielectric material 3008 (e.g., glue layer) that separates the first device layer 3010 and the second device layer 3014. The layer 3016 further includes transparent filling material (e.g., ILD0 oxide material) that separates the features of the dielectric material.

In FIG. 30C, the second device layer 3014 may be formed substantially over the dielectric material 3008 and the transparent filling material of the layer 3016 and may include a second semiconductor device (e.g., a second transistor structure). The second semiconductor device defined in the second device layer 3014 may include a second OD region and a second gate region, where the second device layer 3014 is fabricated using a mask layer that includes features that are aligned relative to the first and the second alignment structures of the first device layer 3010. The layer 3014 may also include a second conductive M0 layer and a partially transparent interlayer dielectric material ILD0 layer that separates the features of the second semiconductor device within the second device layer 3014. Layer 3012 may include an interlayer dielectric material ILD1 layer upon which the conductive layer M1 3002 is provided.

Although the first and the second exemplary structures and methods for lithography alignment are described herein in the context of a device structure having two device layers (e.g., the first device layer and the second device layer), it is noted that the structures and methods may be used to perform lithography alignment for structures having more than two device layers (e.g., more than two transistor layers).

Figure 31:
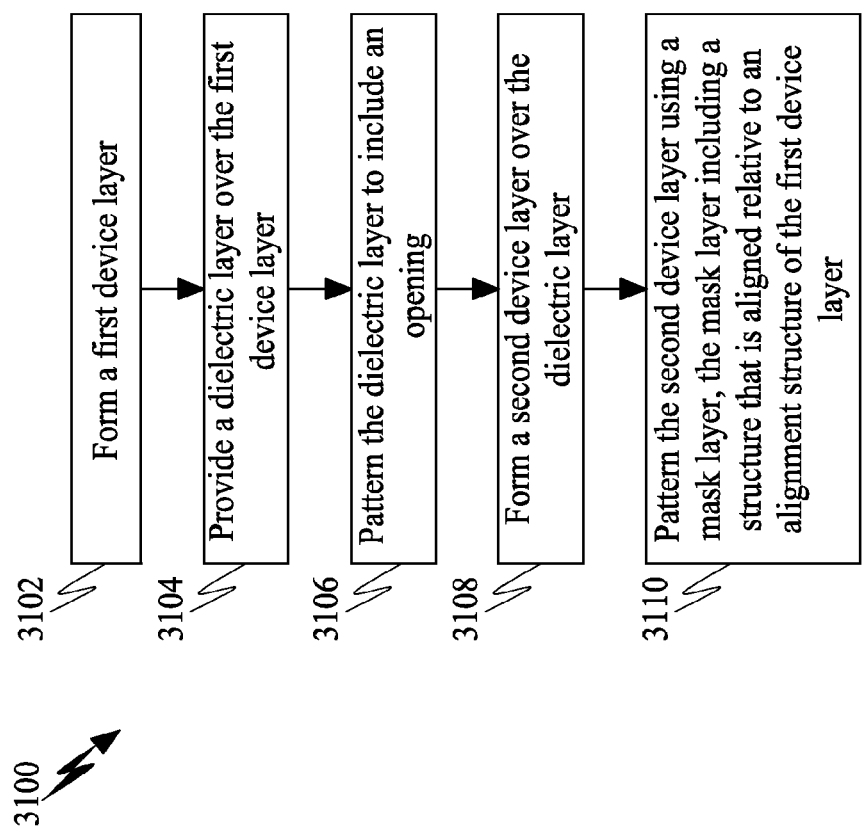
FIG. 31 depicts a flowchart illustrating an example method of fabricating a semiconductor device structure.

FIG. 31 depicts a flowchart 3100 illustrating an example method of fabricating a semiconductor device structure. At 3102, a first device layer may be formed over a substrate, where the first device layer may include a first semiconductor device. An alignment structure may be patterned in the first device layer. At 3104, a dielectric layer may be provided over the first device layer. At 3106, the dielectric layer may be patterned to include an opening over the alignment structure. At 3108, a second device layer may be formed over the dielectric layer, where the second device layer may include a second semiconductor device. At 3110, the second device layer may be patterned using a mask layer, where the mask layer may include a structure that is aligned relative to the alignment structure. The alignment structure may be visible via the opening during the patterning of the second device layer.

Accordingly, the present disclosure is directed to a semiconductor device structure and a method of fabricating a semiconductor device structure. One embodiment of the instant disclosure provides a semiconductor device structure that comprises: a substrate; a first device layer formed over the substrate and including a first transistor having a first active region (e.g., a first active/OD layer) and a first gate region (e.g., a first gate layer), where an alignment structure is patterned in the first active region and the first gate region; a dielectric layer formed over the first device layer, the dielectric layer being patterned to include an opening over each of the alignment structures; and a second device layer formed over the dielectric layer and including a second transistor having a second active region and a second gate region. The second device layer is patterned using a mask layer, where the mask layer includes corresponding structures that are aligned relative to the alignment structures of the first device layer, and wherein the alignment structures are detectable via the opening during the patterning of the second device layer.

Another embodiment of the instant disclosure provides a semiconductor structure that comprises: a first device layer including a first active layer disposed over a substrate and a first gate layer disposed on the active layer, where at least one of the first active layer and the first gate layer includes a first layer alignment structure; a first bounding layer disposed over the first device layer, the first bounding layer including an opening arranged to detectably expose the first layer alignment structure; and a second device layer disposed over the bounding layer including a second layer alignment structure, where the second layer alignment structure is substantially aligned to the first layer alignment structure through the opening.

Yet another embodiment of the instant disclosure provides a multi-layer semiconductor device, which comprises: a first device layer including a first active layer disposed over a substrate and a first gate layer disposed on the active layer, the first device layer including features that define a first transistor, where at least one of the first active layer and the first gate layer includes a first layer alignment structure; a bounding layer disposed over the first device layer, the bounding layer including an opening arranged to detectably expose the first layer alignment structure; and a second device layer disposed over the bounding layer including a second layer alignment structure, the second device layer including features that define a second transistor, where the second layer alignment structure is substantially aligned to the first layer alignment structure through the opening.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method of fabricating a semiconductor device, the method comprising:
fabricating a first device layer over a substrate, the first device layer including a first transistor and a first alignment structure;
providing a layer for a second device layer, the layer for the second device layer including a bounding layer and a semiconductor layer disposed on the bounding layer, over the first device layer;
patterning the semiconductor layer and the bounding layer, thereby forming an opening in the semiconductor layer and the bounding layer, the opening being disposed over the first alignment structure; and
performing a patterning operation on the semiconductor layer, the patterning operation including a lithography operation,
wherein the lithography operation utilizes the first alignment structure to form a resist pattern over the semiconductor layer.

2. The method of claim 1, further comprising patterning filling the opening in the semiconductor layer and the bounding layer with a transparent or semi-transparent material.

3. The method of claim 1, wherein the first alignment structure includes a groove formed in the substrate.

4. The method of claim 3, further comprising patterning the substrate to form the groove.

5. The method of claim 1, wherein:
the first device layer includes a gate electrode layer, and
the first alignment structure includes a patterned gate electrode layer.

6. The method of claim 5, further comprising patterning the gate electrode layer to form the patterned gate electrode layer.

7. The method of claim 1, wherein:
the first device layer further includes an dielectric layer disposed over the first transistor and the first alignment structure, and
the bounding layer is formed on the dielectric layer.

8. The method of claim 7, further comprising patterning filling the opening in the semiconductor layer and the bounding layer with a transparent or semi-transparent material.

9. The method of claim 8, wherein a material for the dielectric layer is the same as a material for the bounding layer.

10. The method of claim 1, wherein a material for the bounding layer includes one selected from the group consisting of $Al_2O_3$ and $HfO_2$.

11. The method of claim 1, wherein the semiconductor layer is selected from the group consisting of Ge, GaAs, SiC, and InGaAs.

12. A method of fabricating a semiconductor device, the method comprising:
fabricating a first device layer over a substrate, the first device layer including a first transistor and a first alignment structure;
providing a layer for a second device layer, the layer for the second device layer including a bounding layer and a semiconductor layer disposed on the bounding layer, over the first device layer;
patterning the semiconductor layer and the bounding layer, thereby forming an opening in the semiconductor layer and the bounding layer, the opening being disposed over the first alignment structure; and
performing a first patterning operation on the semiconductor layer;
forming a layer for a gate electrode over the patterned semiconductor layer;
performing a second patterning operation on the layer for a gate electrode, the second patterning operation including a lithography operation,
wherein the lithography operation utilizes the first alignment structure to form a resist pattern over the layer for a gate electrode.

13. The method of claim 12, further comprising patterning filling the opening in the semiconductor layer and the bounding layer with a transparent or semi-transparent material.

14. The method of claim 12, further comprising patterning the substrate to form a groove as the alignment structure.

15. The method of claim 12, wherein:
the first device layer includes a gate electrode layer, and
the method further comprises patterning the gate electrode layer to form a patterned gate electrode layer as the first alignment structure.

16. The method of claim 12, wherein:
the first device layer further includes an dielectric layer disposed over the first transistor and the first alignment structure, and
the bounding layer is formed on the dielectric layer.

17. The method of claim 16, further comprising patterning filling the opening in the semiconductor layer and the bounding layer with a transparent or semi-transparent material.

18. The method of claim 17, wherein a material for the dielectric layer is the same as a material for the bounding layer.

19. The method of claim 18, wherein a material for the bounding layer includes one selected from the group consisting of $Al_2O_3$ and $HfO_2$.

20. A method of fabricating a semiconductor device, the method comprising:
- fabricating a first device layer over a substrate, the first device layer including a first transistor and a first alignment structure;
- providing a layer for a second device layer, the layer for the second device layer including a bounding layer and a semiconductor layer disposed on the bounding layer, over the first device layer;
- patterning the semiconductor layer and the bounding layer, thereby forming an opening in the semiconductor layer and the bounding layer, the opening being disposed over the first alignment structure;
- filling the opening in the semiconductor layer and the bounding layer with a transparent or semi-transparent material;
- forming a second alignment structure by a photo resist over the semiconductor layer; and
- measuring an overlay error by using the first alignment structure and the second alignment structure.

* * * * *